US011709330B2

(12) United States Patent
Chen et al.

(10) Patent No.: US 11,709,330 B2
(45) Date of Patent: Jul. 25, 2023

(54) MOUNTING CONFIGURATIONS FOR OPTICAL FIBER DISTRIBUTION SYSTEMS

(71) Applicant: Go!Foton Holdings, Inc., Somerset, NJ (US)

(72) Inventors: David Zhi Chen, Dallas, TX (US); Kenichiro Takeuchi, North Brunswick, NJ (US); Edwin M. Astorga, Santa Rosa (PH); Elmer N. Prado, Paranaque (PH)

(73) Assignee: Go!Foton Holdings, Inc., Somerset, NJ (US)

( * ) Notice: Subject to any disclaimer, the term of this patent is extended or adjusted under 35 U.S.C. 154(b) by 637 days.

(21) Appl. No.: 16/728,516

(22) Filed: Dec. 27, 2019

(65) Prior Publication Data

US 2020/0218023 A1 Jul. 9, 2020

Related U.S. Application Data

(60) Provisional application No. 62/785,401, filed on Dec. 27, 2018.

(51) Int. Cl.
*G02B 6/44* (2006.01)
*F16M 13/02* (2006.01)
(Continued)

(52) U.S. Cl.
CPC ......... *G02B 6/4452* (2013.01); *F16M 13/022* (2013.01); *H04Q 1/131* (2013.01); *H05K 7/183* (2013.01)

(58) Field of Classification Search
CPC .. G02B 6/4452; G02B 6/4451; G02B 6/4442; G02B 6/4466; G02B 6/4471; G02B 6/4455; F16M 13/022; F16M 11/10; F16M 11/18; F16M 11/38; H04Q 1/131; H04Q 1/06; H04Q 1/13; H05K 7/183; H05K 7/1488; H05K 7/14; H05K 7/1489; H05K 7/18; H05K 7/1492; H02G 9/10; H02G 11/00; A47B 46/005
See application file for complete search history.

(56) References Cited

U.S. PATENT DOCUMENTS 2,210,762 A * 8/1940 Itzigson ................. B60J 3/0204
16/358
2,299,409 A * 10/1942 Rathburn .................. E04H 1/14
312/328
(Continued)

*Primary Examiner* — Ko H Chan
(74) *Attorney, Agent, or Firm* — Lerner David LLP

(57) ABSTRACT

A cable management unit including a support assembly for mounting a patch panel, such as to a wall. The support assembly may include first and second anchor members adapted to be anchored to the wall, and first and second support arms hingedly coupled to the first and second anchor members at first and second hinge points, respectively. The first and second support arms may be adapted to be coupled to the patch panel. A chassis the patch panel may be supported by the first and second support arms. The first and second support arms may be configured to pivot about the first and second hinge points respectively between storage and access positions. The first and second support arms may extend outward from the wall in the access position and may be substantially parallel to the wall in the storage position.

10 Claims, 18 Drawing Sheets

(51) Int. Cl.
*H05K 7/18* (2006.01)
*H04Q 1/02* (2006.01)

(56) References Cited

U.S. PATENT DOCUMENTS

| | | | | |
|---|---|---|---|---|
| 2,584,173 A * | 2/1952 | Fowler | ............... | A47B 88/48 |
| | | | | 312/308 |
| 4,843,680 A * | 7/1989 | Cress | ............... | E05D 3/186 |
| | | | | 16/370 |
| 5,169,221 A * | 12/1992 | Wheeler | ............... | H05K 7/16 |
| | | | | 248/299.1 |
| 7,097,047 B2 * | 8/2006 | Lee | ............... | H05K 7/1491 |
| | | | | 361/825 |
| 7,757,349 B2 * | 7/2010 | Laursen | ............... | H04Q 1/09 |
| | | | | 16/358 |
| 10,359,595 B2 * | 7/2019 | Aramayo | ............... | G02B 6/4455 |
| 10,383,441 B1 * | 8/2019 | Zhang | ............... | A47B 88/48 |
| 10,627,591 B2 * | 4/2020 | Geling | ............... | G02B 6/4452 |
| 11,435,542 B2 * | 9/2022 | Pilon | ............... | G02B 6/4455 |
| 2001/0026436 A1 * | 10/2001 | Tanzer | ............... | H01R 25/006 |
| | | | | 361/725 |
| 2004/0228098 A1 * | 11/2004 | Robbins | ............... | H01R 25/006 |
| | | | | 361/725 |
| 2006/0275008 A1 * | 12/2006 | Xin | ............... | G02B 6/4455 |
| | | | | 385/135 |
| 2013/0209049 A1 * | 8/2013 | Kowalczyk | ............... | G02B 6/4457 |
| | | | | 385/135 |
| 2015/0257295 A1 * | 9/2015 | Lu | ............... | H04Q 1/021 |
| | | | | 312/223.2 |
| 2019/0323629 A1 * | 10/2019 | Chen | ............... | H05K 7/183 |
| 2019/0373758 A1 * | 12/2019 | Chen | ............... | A47B 88/483 |
| 2021/0364722 A1 * | 11/2021 | Boucher | ............... | H02G 3/081 |

* cited by examiner

MOUNTING CONFIGURATIONS FOR OPTICAL FIBER DISTRIBUTION SYSTEMS

CROSS-REFERENCE TO RELATED APPLICATION

The present application claims the benefit of the filing date of U.S. Provisional Patent Application No. 62/785,401 filed Dec. 27, 2018, the disclosure of which is hereby incorporated herein by reference.

BACKGROUND OF THE INVENTION

The present disclosure generally relates to a device and a system for routing and managing cables coupled to communication connectors, adapters, and/or ports. More particularly, the present disclosure relates to cable routing and management systems for patch panel devices.

In communications cabinets and racks, a multitude of cables are interconnected to one another through connectors, e.g., adapters. A cable organization unit typically has a tray or a shelf or a similar platform, which supports the connectors. Examples of cable organization units include optical fiber distribution systems, including but not limited to patch panels.

A patch panel houses cable connectors, and is commonly two-sided; the front of the patch panel provides for connections to relatively short wires or cables, and the rear of the patch panel usually provides for connection to relatively long wires or cables. This setup facilitates the performance of temporary alterations to the front of the patch panel without disturbing the connections in the rear. Alternatively, a patch panel may be one-sided, whereby either the front or the rear of the patch panel provides connection for all of the cables. The patch panel facilitates interconnecting, monitoring, and circuit testing of equipment without necessitating costly switching equipment.

Early applications for patch panels were for telephone exchanges, where they are still used albeit in a more automated form. Patch panels are also used extensively in the entertainment industry, e.g., in recording and television studios. They are also used in concert halls to manage connections among equipment, e.g., microphones, speakers, and other electronic equipment. Patch panels are valued for such purposes not only for their convenience and relative cost effectiveness, but also because they make it easier to identify problems such as feedback, ground loops, and static.

In order to maintain accessibility the cables, the cables may be run through a cable guide. The cable guide has a fixed position with respect to the housing of the cable organization unit and supports at least some of the cables engaged with the cable connectors. The cable guide can reduce the amount of movement among the cables as the cables are connected and disconnected from the connectors of the cable organization unit, thus facilitating the use of relatively short cables while also preventing the cables from becoming tangled.

Often the patch panel is mounted on a rack. The cable guide may be mounted to a fixed portion of the rack, such as sidewall, such that the cables extend through the cable guide along the rack sidewall towards the respective cable connectors. Although the rack provides a fixed component through which the cables can be guided, the rack itself may occupy a significant amount of area, which can be undesirable where there is limited space.

Thus, there is a need for new devices and systems to facilitate mounting of patch panel while also providing for the cables to be efficiently guided to the patch panel.

BRIEF SUMMARY OF THE INVENTION

One aspect of the present disclosure is directed to a support assembly for mounting a patch panel to a wall. The support assembly may include first and second anchor members adapted to be anchored to the wall, a first support arm hingedly coupled to the first anchor member at a first hinge point, and a second support arm hingedly coupled to the second anchor member at a second hinge point. The first and second support arms may be adapted to be coupled to a chassis of the patch panel. The patch panel may be supported by the first and second support arms. The first and second support arms may be configured to rotationally pivot about the first and second hinge points respectively between a storage position and an access position. The first support arm and second support arm may extend outward from the wall when in the access position and may be substantially parallel to the wall in the storage position.

In some examples, the first and second support arms may extend parallel to the wall in an upward direction from the first and second hinge points, respectively, when in the storage position.

In some examples, the first anchor member may be coupled to the first support arm by a first pivot hinge, and the second anchor member may be coupled to the second support arm by a second pivot hinge. The first anchor member may include a first protrusion extending therefrom in a direction towards the first support arm, and the second anchor member may include a second protrusion extending therefrom in a direction towards the second support arm. Each of the first and second support arms may include a respective first end adapted to be coupled to the chassis and a respective second end opposite the first end and adapted to engage the first and second protrusions, respectively, when the first and second support arms are rotationally pivoted to the access position. In some instances, the second end of the first support arm may be bent and may extend towards the first anchor member to engage the first protrusion. The second end of the second support arm may be bent and may extend towards the second anchor member to engage the second protrusion. In other instances, the respective second ends of first and second support arms may be straight and may extend in a direction away from the respective opposing first ends.

In some examples, the first support arm may be coupled to the first anchor member by a first torque hinge, and the second support arm may be coupled to the second anchor member by a second torque hinge.

In some examples, the first and second support arms extend parallel to the wall in a downward direction from the first and second hinge points, respectively, when in the storage position. In some instances, each of the first and second support arms may include a respective first end adapted to be coupled to the chassis and an opposing respective second end at the first and second hinge points, respectively. The support assembly may further include, a first foldable bracket hingedly coupled to the first anchor member at a point below the first hinge point and hingedly coupled to the first end of the first support arm, and a second foldable bracket hingedly coupled to the second anchor member at a point below the second hinge point and hingedly coupled to the first end of the second support arm. Each of the first and second foldable brackets may include a respective middle hinge configured to fold the corresponding foldable bracket. The first and second foldable brackets may be folded in the storage position and may be straightened in the access position. Also, in some instances, one of the foldable brackets may include a protrusion, and the other foldable bracket may include a slot configured to engage the protrusion to rotationally lock the foldable bracket. The middle hinge may include a pivot joint having a rod coupled to an aperture. The aperture may be elongated in a lengthwise direction of the foldable brackets, whereby translating the rod in the lengthwise direction of the foldable aperture may cause the slot to engage or disengage from the protrusion In some examples, the support may further include a pin coupled to the first anchor member, and an indentation on a surface of the first support arm facing towards the first anchor member. The pin may be positioned opposite the indentation when the support assembly is in the access position. The pin may be configured to an engage the indentation to avoid the support assembly moving from the access position to the storage position.

In some examples, the support assembly may further include a hanger mounted to one of the first and second anchor members in proximity to the corresponding hinge point of the anchor member. The hanger may be adapted to support one or more cables thereon.

Another aspect of the present disclosure is a support assembly for mounting a patch panel under a floor. The support assembly may include a scissor lift having first and second foldable supports positioned on a surface of a cavity underneath the floor and extending upward when unfolded, and a platform positioned on top of the first and second foldable supports. The platform may have a lower surface facing towards the surface of the cavity, and an upper surface adapted to support a chassis of the patch panel. The platform may be adapted to translate between a storage position and an access position. The scissor lift may be in a folded state in the storage position and in an extended state in the access position. The platform may be configured to move the patch panel above a plane of the floor through an opening in the floor when the platform is in the storage position.

In some examples, the support assembly may further include a rotatable shaft coupled at first connection to point to the first foldable support and at a second connection point to the second foldable support. Rotation of the shaft may cause a lateral distance between the first and second connection points to change. In some instance, the support assembly may further include a crank coupleable to the shaft, and rotation of the crank may cause rotation of the shaft In some examples, the support assembly may include a spring loaded shaft coupled at first connection to point to the first foldable support and at a second connection point to the second foldable support. A spring force of the spring loaded shaft may be configured to cause a lateral distance between the first and second connection points to become shorter, and the spring loaded shaft may be configured for the spring force to partially or entirely counterbalance a weight of the patch panel.

In some examples, the support assembly may include a handle for moving the platform between the storage position and the access position.

Yet another aspect of the present disclosure is a cable management unit including a support assembly as described herein, and a patch panel having a chassis mounted to the support assembly.

In the case of a wall-mounted patch panel, the patch panel may include a plurality of cable connectors on a front side of the patch panel that faces away from the wall when the patch panel is in the access position, and the plurality of cable connectors may be configured to be interconnected with one another inside the patch panel. Alternatively, the patch panel may include a first plurality of cable connectors on a front side of the patch panel that faces away from the wall when the patch panel is in the access position, and a second plurality of cable connectors on a back side of the patch panel that faces towards the wall when the patch panel is in the access position. The first plurality of cable connectors may be accessible when the patch panel is in the access position, and the second plurality of cable connectors may be accessible when the patch panel is in the storage position.

Yet a further aspect of the present disclosure is a support assembly for mounting a patch panel to a wall of an opening under a floor. The support assembly may include a base adapted to support the patch panel, the base including one or more openings for passing one or more cables between an interior and an exterior of the patch panel, a supporting member adapted to be fixedly mounted to the wall, and a hinge adapted to hingedly connect the base to the supporting member, wherein the hinge is positioned in proximity to the one or more openings. The base may be configured to rotationally pivot about the hinge between a storage position and an access position, the patch panel may be positioned in a first orientation and contained entirely in the opening when in the storage position, and the patch panel may be positioned in a second orientation different from the first orientation when in the access position. In some examples, the first orientation may be a sideways orientation, and the second orientation may be an upright orientation.

In some examples, a sidewall of the base may extend in a height direction of the patch panel to form a handle, and the handle may be configured to move the patch panel from the storage position to the access position when pulled upwards.

In some examples, the support assembly may further include a counterweight positioned on an opposite side of the hinge from the patch panel. In some examples, the support assembly may include a stopper configured to engage a sidewall of the supporting member when the base is in the access position. The counterweight may be positioned to apply a force on the stopper to keep the stopper engaged to the sidewall of the supporting member when the base is in the access position.

In some examples, the support assembly may further include a retaining member for supporting a portion of the patch panel's weight. In some examples, the retaining member may be a strap looped around the patch panel and at least a portion of the base.

One further aspect of the present disclosure is a support assembly for mounting a cable management unit to a wall of an opening under a floor. The support assembly may include first and second anchor members adapted to be anchored to the wall, a first support arm hingedly coupled to the first anchor member at a first hinge point, and a second support arm hingedly coupled to the second anchor member at a second hinge point. The first and second support arms may be adapted to be coupled to a housing of the patch panel, whereby the patch panel is supported by the first and second support arms. The first and second support arms may be configured to rotationally pivot about the first and second hinge points respectively between a storage position and an access position, such that the first support arm and second support arm extend outward from the wall when in the storage position and are substantially parallel to the wall in the access position.

DETAILED DESCRIPTION

Figure 1:
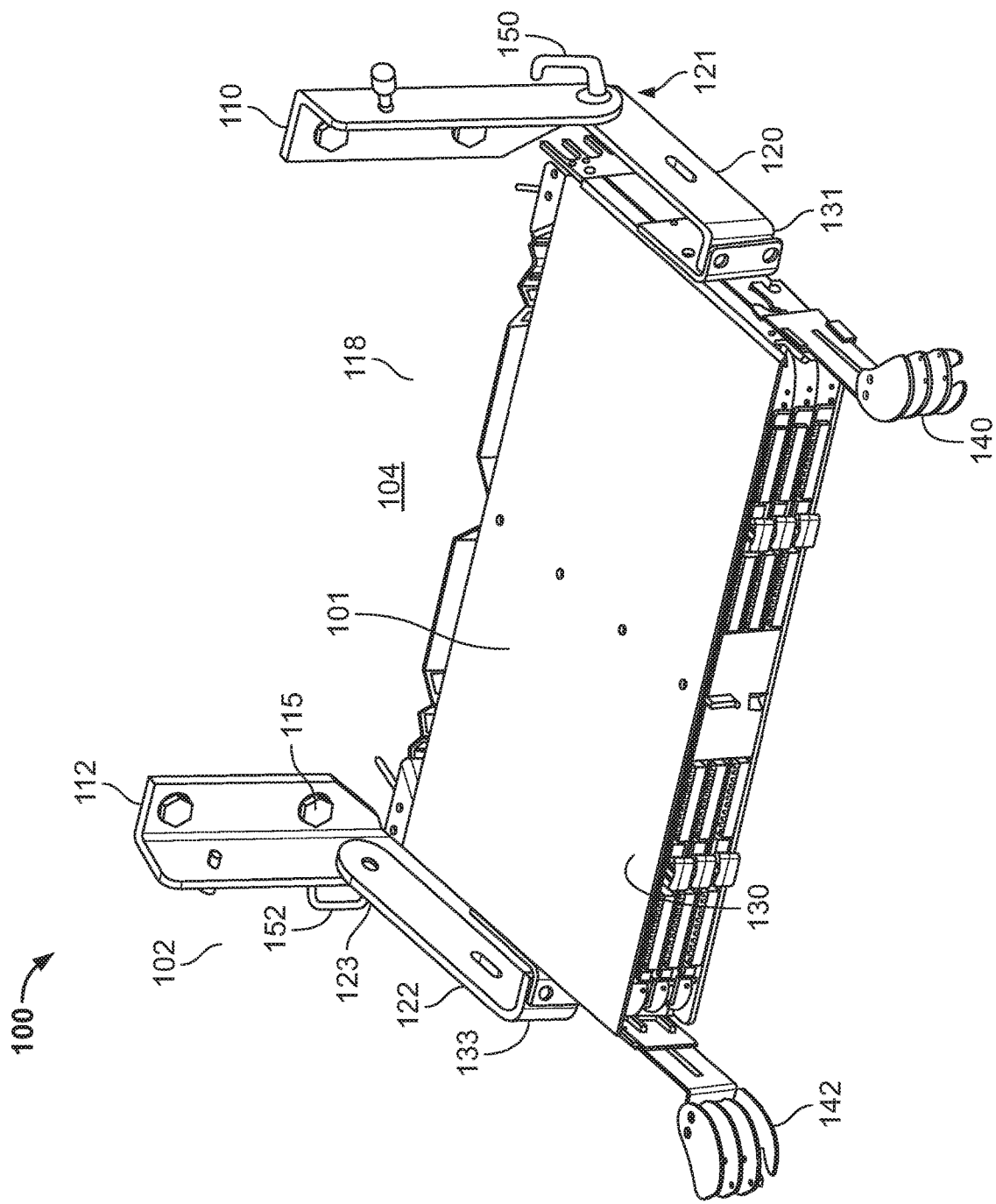
FIG. 1 is a perspective view of a cable management system having a support structure for mounting the cable management system to a wall, in accordance with an aspect of the disclosure.

Particular embodiments of the present disclosure are described with reference to the accompanying drawings. In the figures and in the description that follow, in which like reference numerals identify similar or identical elements, the term "outward" refers to a direction toward the "front" end of the device that is closest to the operator or user during use, while the term "inward" refers to a direction toward the "back" end of the device that is farther from the operator or user during use.

Referring to FIG. 1, the cable management unit 100 may include a patch panel 101 and a support assembly 102 adapted for mounting the patch panel 101 to a wall 104. The support assembly 102 may itself be mounted to the wall 104. For example, the support assembly 102 may include a first anchor member 110 and a second anchor member 112 mounted to the wall 104. The anchor members 110, 112 may be made of a rigid mounting material such as steel or brass. In the example of FIG. 1, each anchor member 110, 112 is a bracket and is mounted using drill screws 115. The bracket is bent at an angle (e.g., a 90 degree angle, greater than a 90 degree angle), such that one portion of the bracket rests flush with the wall, and the other bent portion of the bracket protrudes outward from the wall. Each bent bracket defines a space 118 in between the brackets, the space having a width equal to a distance between the bent portions of the brackets, a height equal to a length of the brackets, and a depth equal to a width of the bent portion of each bracket.

The support assembly 102 may further include first and second support arms 120, 122. The support arms 120, 122 may be hingedly connected to a respective anchor member 110, 112 by a respective hinge (not shown) at a respective hinge point 121, 123. The support arms 120, 122 may be configured to rotationally pivot at the respective hinge points 121, 123. The support arms 120, 122 may be made of a rigid material the same or similar to that of the anchor members 110, 112. However, any material capable of supporting the weight of the patch panel 101 may be used.

In FIG. 1, the support assembly is shown in an access position, in which the support arms 120, 122 extend outward away from the wall 104. When the support arms 120, 122 pivot about the hinge points 121, 123, the support arms 120, 122 fold upwards into a storage position. In the storage position, the support arms 120, 122 may be parallel to the wall 104, and may further occupy the space 118 between the anchor members 110, 112.

The support arms 120, 122 may further be adapted to be coupled to a chassis 130 of the patch panel 101. The first support arm 120 may be bolted to a first sidewall of the chassis, and the second support arm 122 may be bolted to a second, opposing sidewall of the chassis. In the example of FIG. 1, an end 131, 133 of each support arm opposite the hinge points 121, 123 is bent towards the patch panel 101 and inwards towards the wall 104, and the chassis 130 is fastened to the bent ends 131, 133 on either side.

The patch panel 101 may be a one-sided patch panel, whereby a plurality of cables are connected to a front end. The patch panel 101 may be configured to switchably interconnect the cables connected to the front end. In order to improve management of the cables, each cable may be placed through the front hangers 140, 142 extending in front of the connection ports on one or both sides of the patch panel 101. The cables may then be bent backward and run in the direction of the sidewalls of the chassis 130 until reaching the back hangers 150, 152 positioned in proximity to the respective hinge points 131, 133. The back hangers 150, 152 may include one or more hooks for supporting one or more cables. In the example of FIG. 1, the hooks are mounted to the bent portions of the anchor members 110, 112. However, in other examples, the hooks may be mounted to other structures in proximity to the hinge points 131, 133, such as the support arms 120, 122 or the wall 104.

In operation, when the support assembly 100 is in the access position, a user may be able to access the plurality of cables (e.g., insert the cables into the connectors, remove the cables from the connectors, etc.), as the front of the patch panel faces outward, away from the wall 104. By contrast, when the support assembly 100 is in the storage position, the plurality of cables may be inaccessible to the user, as the assembly is folded up and the front of the patch panel 101 faces upward towards a ceiling.

Figure 2:
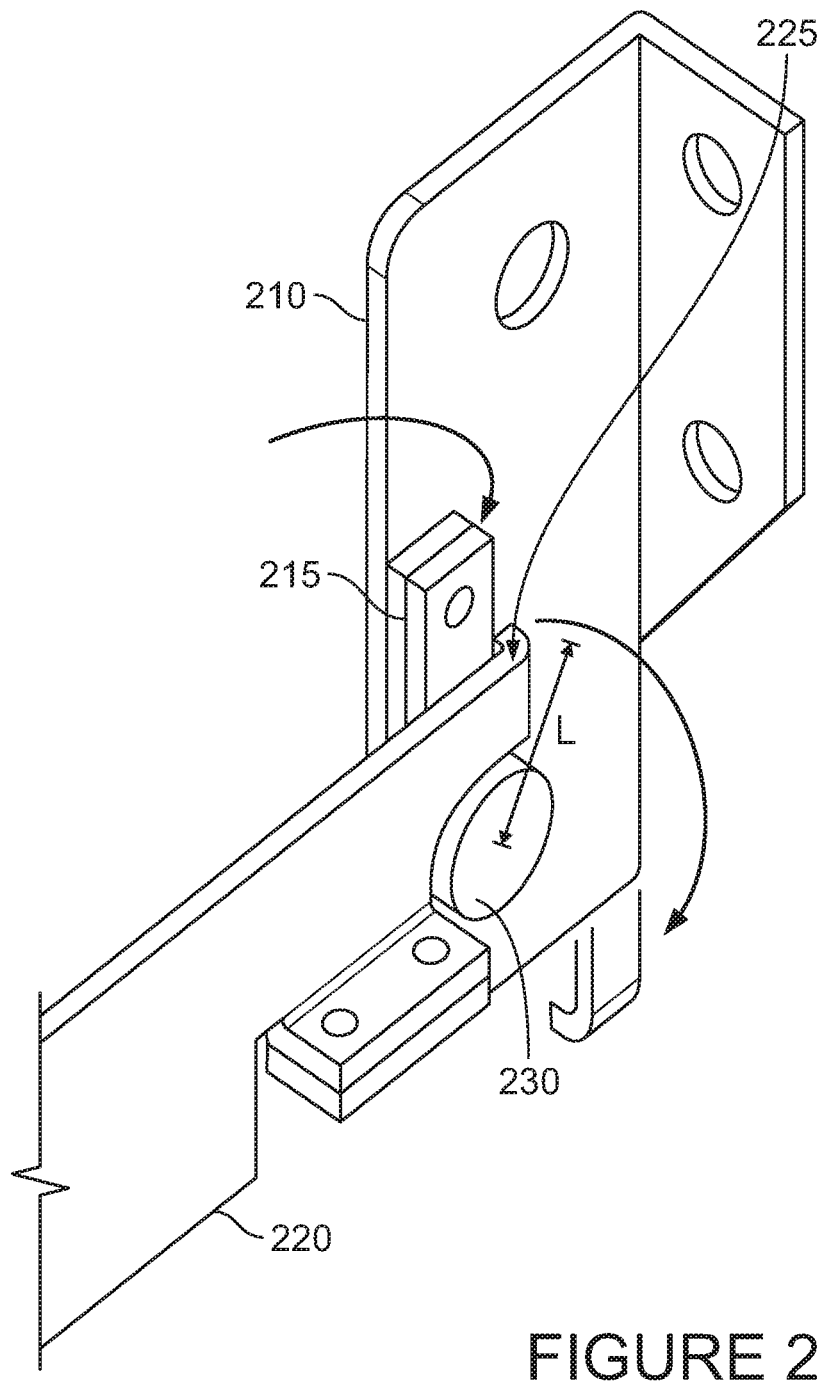
FIGS. 2, 3 and 4 are respective zoomed images of alternative hinges in the support structure of FIG. 1.
Figure 3:
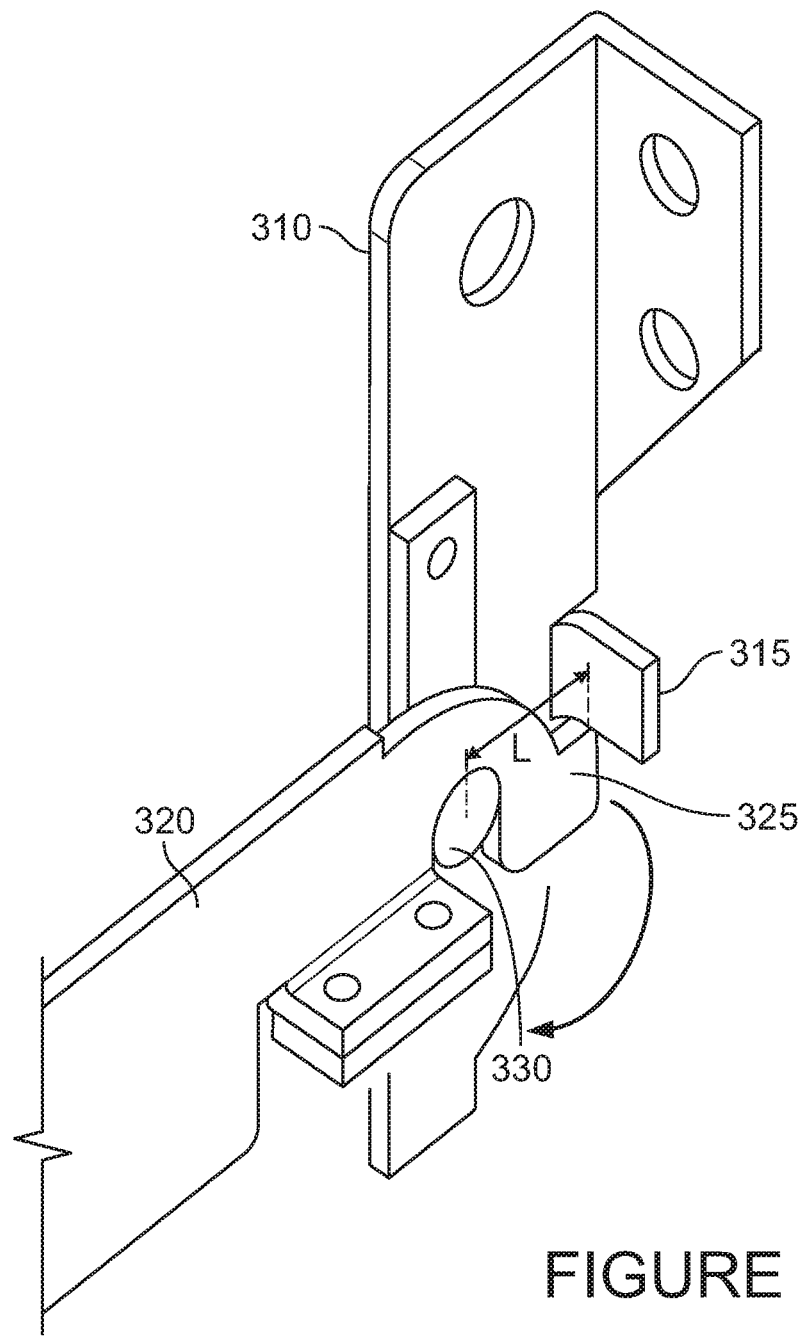
Figure 4:
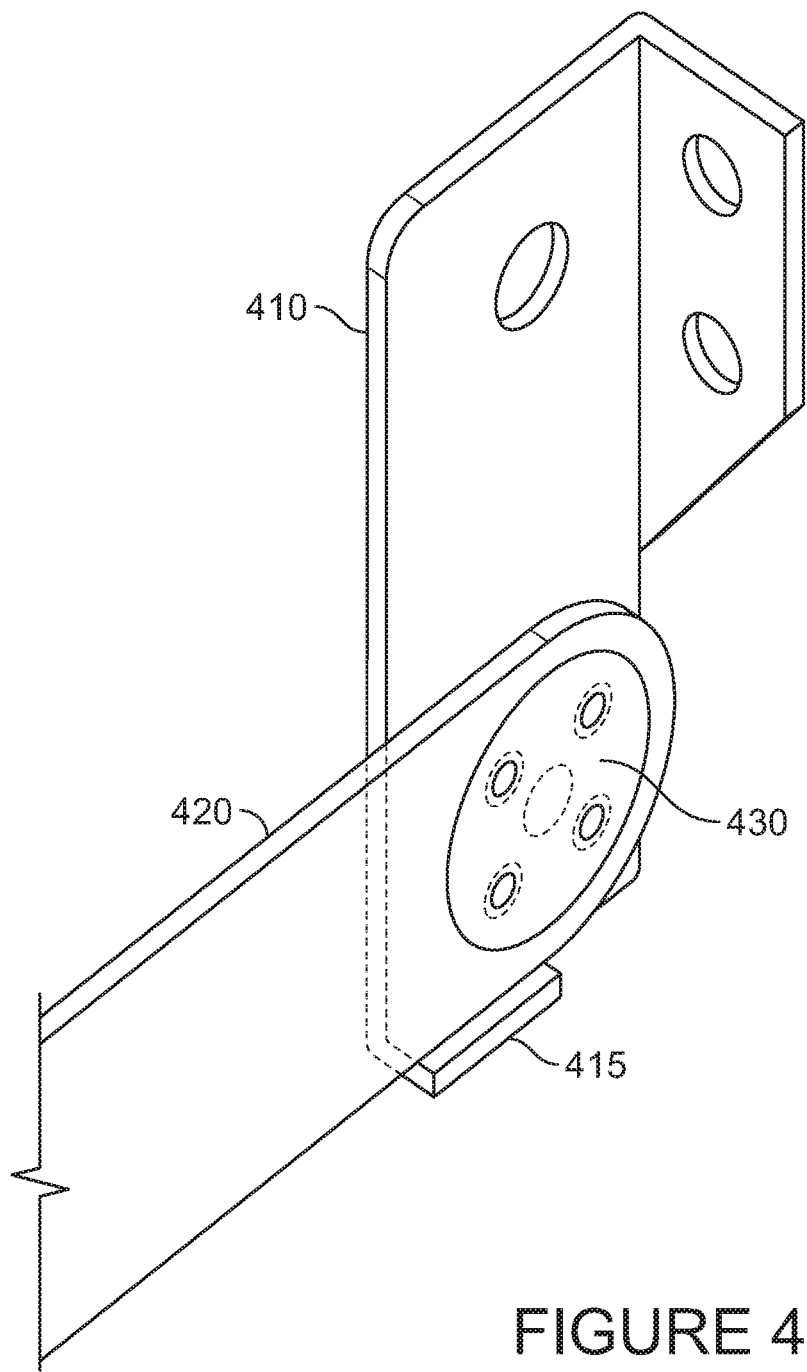

FIGS. 2-4 show alternative example hinged connections between an anchor member and a support arm. Each example hinge permits for the support arm to rotationally pivot 90 degrees between the storage and access positions, and further avoids the support arm pivoting further than a desired amount.

In FIG. 2, an anchor member 210 and a support arm 220 are connected by pivot hinge 230. The anchor member 210 may have a protrusion 215 that protrudes in a direction towards the support arm 220. Additionally, the end 225 of the support arm 220 in proximity to the hinge 230 may be bent in a direction towards the anchor member 210. In this manner, the protrusion 215 and the end 225 may be adapted to engage one another at a distance L radially from the hinge 230 upon the support arm 220 being pivoted to the access position. This may avoid the support arm 220 continuing to rotate past the access position. The hinge shown in FIG. 2 may be used in one or both of the anchor member/support arm pairs in the support assembly.

In FIG. 3, an anchor member 310 and a support arm 320 are connected by pivot hinge 330. The anchor member 310 may have a protrusion 315 that protrudes in a direction towards the support arm 320. Additionally, the end 325 of the support arm 320 in proximity to the hinge 330 may extend straight in a direction away from the opposing end of the support arm. In this manner, the protrusion 315 and the end 325 may be adapted to engage one another at a distance L radially from the hinge 330 upon the support arm 220 being pivoted to the access position. This may avoid the support arm 320 continuing to rotate past the access position. The hinge shown in FIG. 3 may be used in one or both of the anchor member/support arm pairs in the support assembly.

The point of engagement between the protrusion and the support arm may be located at any point relative to the hinge, such as above the hinge, below the hinge or between the hinge and the wall. For instance, in the example of FIG. 2, the protrusion 215 and end 225 are shown engaging one another at a point above the hinge 230. For further instance, in the example of FIG. 3, the protrusion 315 and end 325 are shown engaging one another at a point between the hinge 330 and the wall (which is flush with the portion of the anchor member 310 that does not include the protrusion 315). Nonetheless, one skilled in the art will recognize that the locations of the engagement points of the respective examples may be swapped or otherwise changed as desired.

In FIG. 4, an anchor member 410 and a support arm 420 are connected by torque hinge 430. The torque hinge 430 may be configured to slow a pivoting motion of the support arm 420 from the upright storage position to the outward access position. A stopper 415 extended from the anchor member 410 in a direction toward the support arm 420 may be positioned underneath and in front of the torque hinge 430, such that the support arm 420 comes to a rest on the stopper 415 when it reaches the access position. The torque hinge 430 may further be configured to stop the pivoting motion of the support arm 420 when the support arm 420 reaches the access position. As with the examples of FIGS. 2 and 3, the torque hinge shown in FIG. 4 may be used in one or both of the anchor member/support arm pairs in the support assembly.

Figure 5:
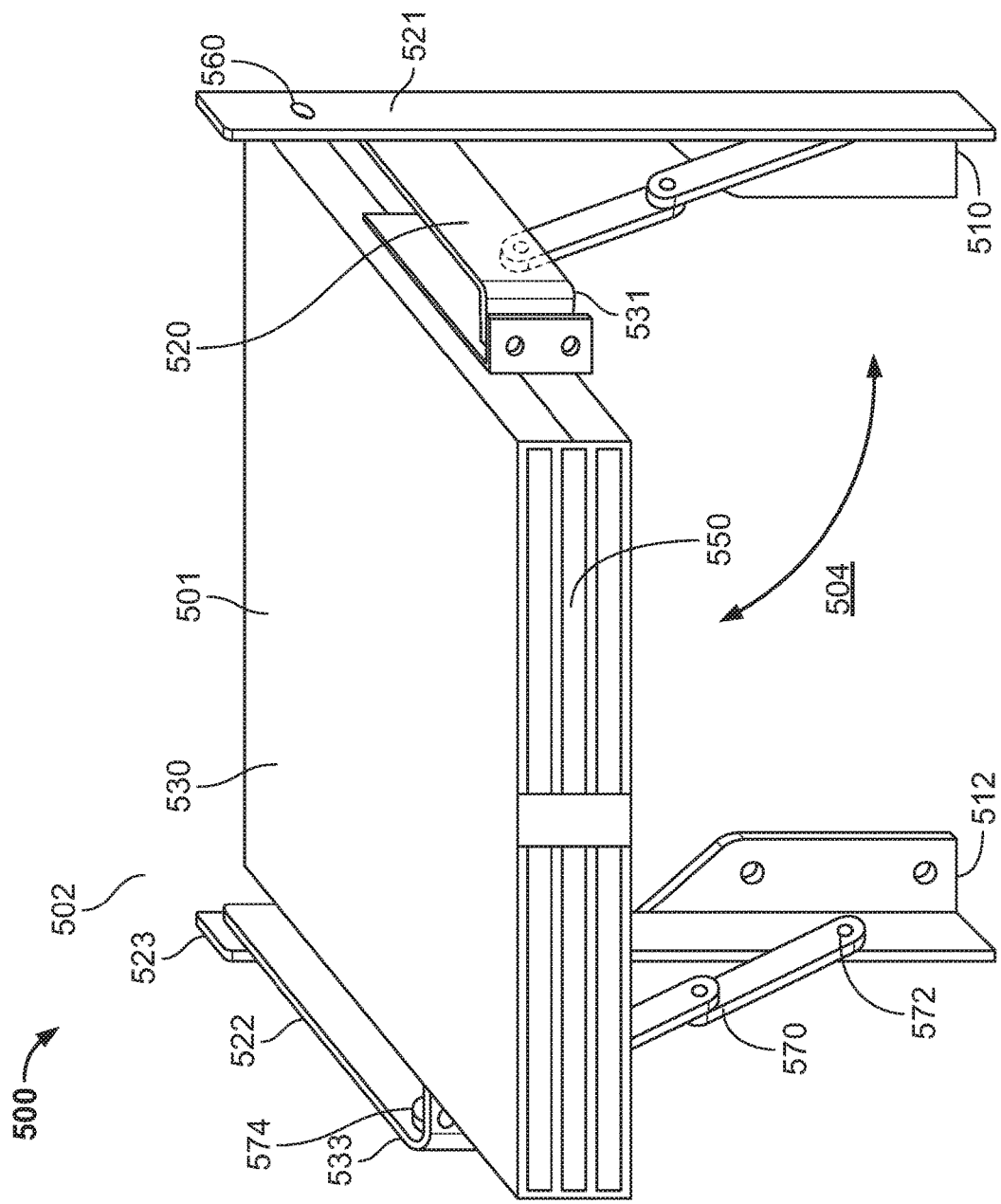
FIG. 5 is a perspective view of another cable management system having a support structure in a service position, in accordance with an aspect of the disclosure.

The example assembly shown in FIG. 1 and the example hinges of FIGS. 2-4 are all shown as designed to allow the support assembly and patch panel to fold up and against the wall. However, in other examples of the present disclosure, the support assembly and patch panel may be designed to fold down and against the wall. For instance, FIG. 5 shows an example cable management unit 500 having a support assembly 502 that is adapted to support a patch panel 501 and fold downwards against a wall 504.

The support assembly 502 may include anchor members 510, 512 that are comparable to the anchor members of FIGS. 1-4, except that anchor members 510, 512 are oriented upside-down from those of the previous examples. In this regard, whereas the anchor members of FIGS. 1-4 were shown as being mounted to the wall at a point above the respective hinge points 521, 523, the anchor members 510, 512 are shown as being drilled into wall 504 at a point below the hinge points 521, 523. One reason for reversing the orientation of the anchor members 510, 512 is to ensure that the chassis 530 of the patch panel 501 folds into a space 518 between the anchor members 510, 512, as opposed to hanging freely on the wall underneath the anchor members. Nonetheless, one skilled in the art will appreciate that the point of connection to the wall and to the hinge point may be changed (e.g., the orientation of the anchor member reversed) in FIG. 5, as well as any other given example of the disclosure, as desired.

The support assembly 502 may also include support arms 520, 522 that are comparable to the support arms of FIGS. 1-4. The support arms 520, 522 may connect to the respective anchor members 510, 512 at respective hinge points 521, 523, and the front ends 531, 533 of the respective support arms 520, 522 may further be configured to support a chassis 530 of a patch panel 501.

Figure 6:
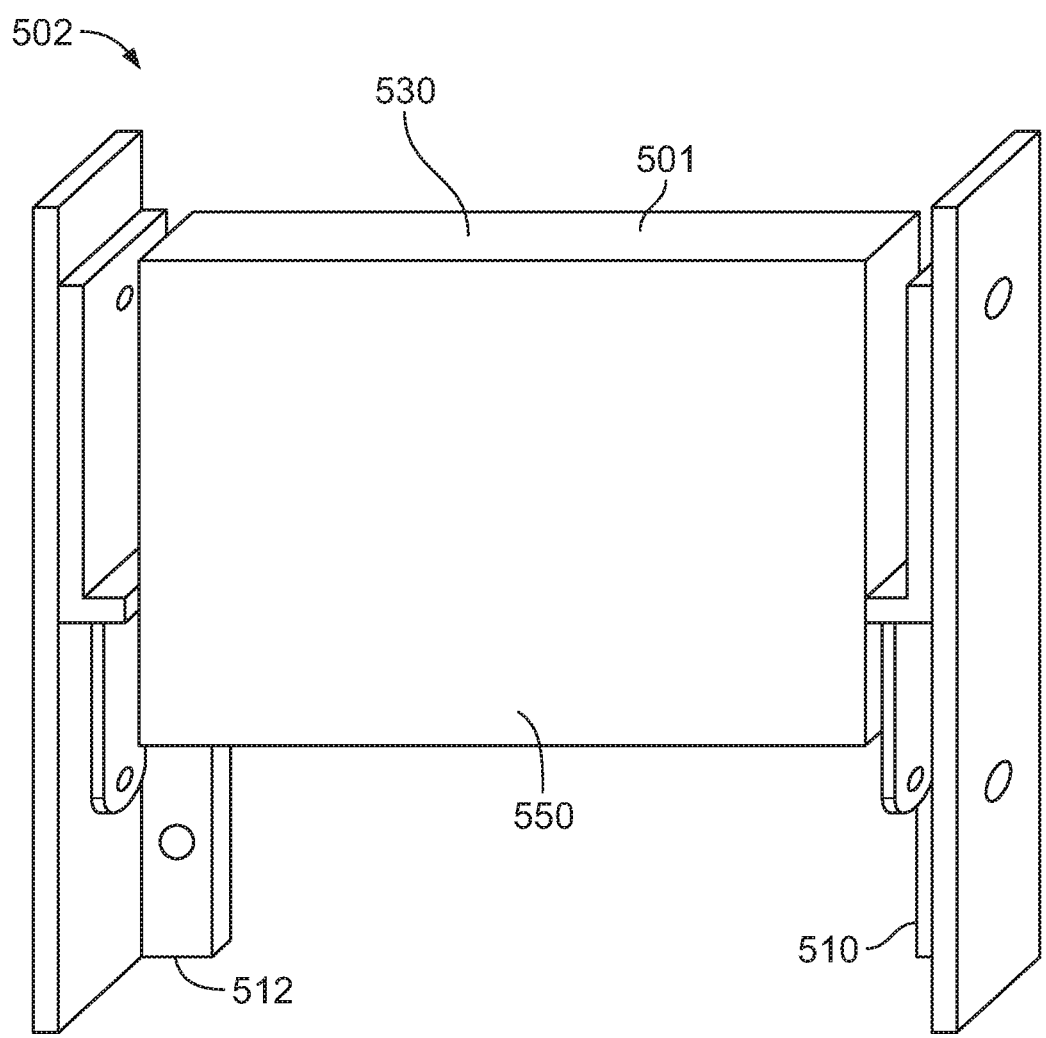
FIG. 6 is a perspective view of the cable management system of FIG. 2 having the support structure in a storage position.

As with the above examples, in operation, when the support assembly 502 is in the access position, a user may be able to access the outward-facing front 550 of the patch panel 501. When the support assembly 502 is in the storage position, as shown in FIG. 6, the front 550 of the patch panel 501 may be inaccessible, as it is folded down and facing a floor.

The example of FIG. 5 features two mechanisms for locking the assembly 502 in the access position and preventing it from returning to the storage position by the force of its own weight. A first locking mechanism shown is a pin 560, shown in greater detail in FIG. 7. A second locking mechanism shown is a hinged foldable bracket 570, shown in greater detail in FIGS. 8A and 8B.

Figure 7:
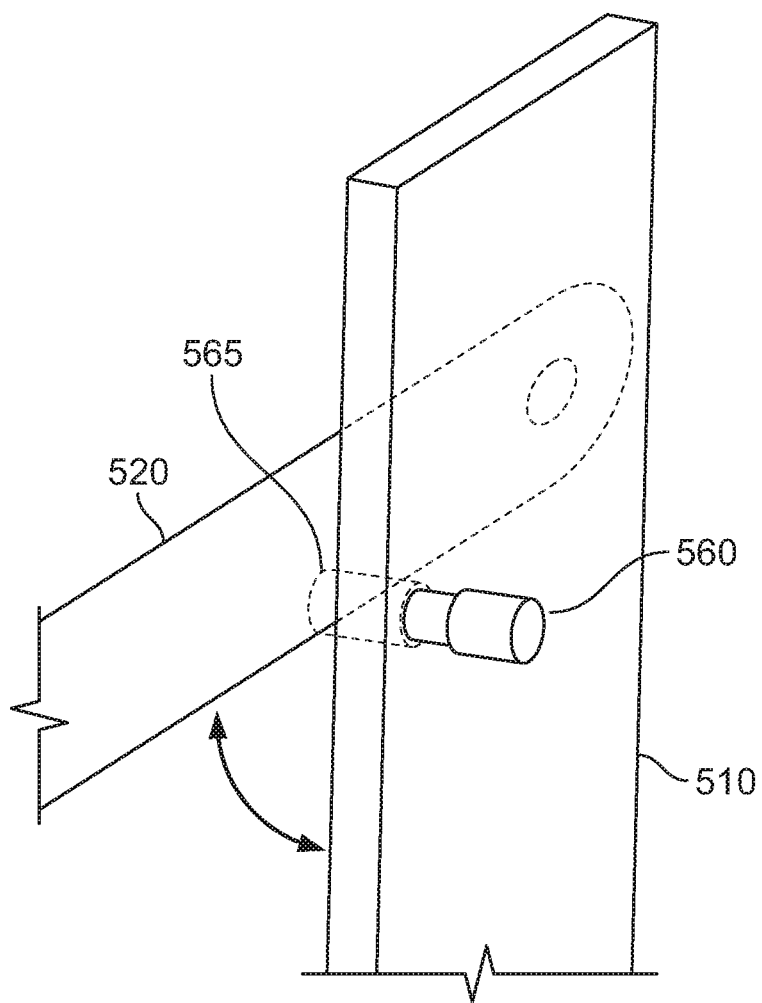
FIG. 7 is a zoomed image of a first hinge in the support structure of FIG. 6.

In FIG. 7, the pin 560 may be coupled to an anchor member 560. The pin 560 may include a spring that biases the pin 560 towards a support arm 520 hingedly coupled to the anchor member 510 at hinge point 521. The support arm 520 may further include an indentation 565 configured to engage the pin 560 when the assembly is in the access position. The indentation 565 engaging the pin 560 prevents the support arm 520 from dropping out of the access position under its own weight. In operation, the indentation 565 and pin 560 may be engaged by manually pulling the pin 560 in a direction away from the support arm 520 so that the indentation 565 is free to slide into position across from the pin 560, and then releasing the pin 560, thereby causing the spring to bias the pin 560 towards the indentation 565. The assembly may be released from the access position by manually pulling the pin 560 away from the support arm 520, thereby disengaging the pin 560 from the indentation. This mechanism is especially useful for use with a relatively lightweight patch panel.

Referring to FIG. 5 and to FIGS. 8A and 8B, the bracket 570 may include a first hinge 572 coupled to the anchor member 512 at a point below the hinge point 523. The bracket 570 may further include a second hinge 574 coupled to the support arm at an end of the support arm 522 extending away from the hinge point 523 (e.g., for an assembly in the access position, extending outward away from the wall 504). The bracket 570 may further include first and second support members 576, 578 that may be joined by a third hinge 580.

The first support member may be hingedly attached to the anchor member 510 by the first hinge 572, and the second support member 578 may be attached to the support arm 520 by the second hinge 574. The third hinge may fold 180 degrees, such that the first and second support members 576, 578 may fold one on top of another when the assembly 502 is in the storage position, and the first and second support members 576, 578 may form a straight line when the assembly is in the access position. The straight line may be diagonal running from the first hinge 572 to the second hinge 574, that is, from the point on the anchor member 510 below the hinge point 521 to the end of the support arm 520 engaging the chassis 530 of the patch panel 501.

Figure 8A:
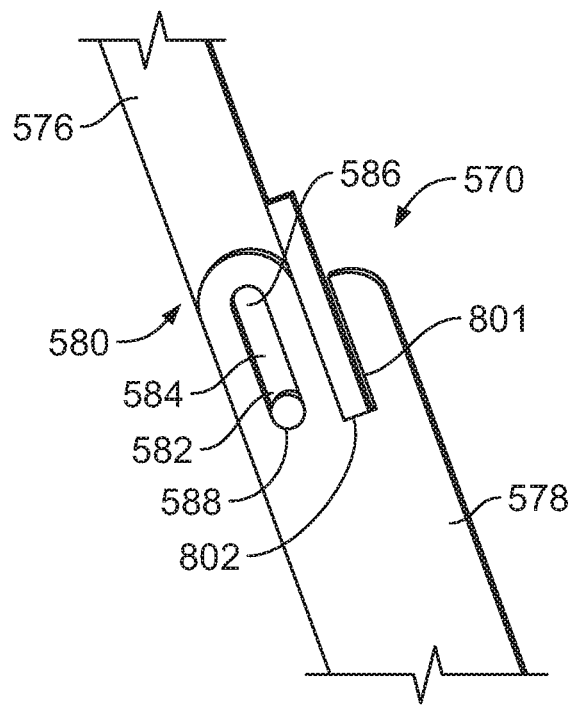
FIG. 8A is a zoomed image of a second hinge in the support structure of FIG. 6 in a locked position.
Figure 8B:
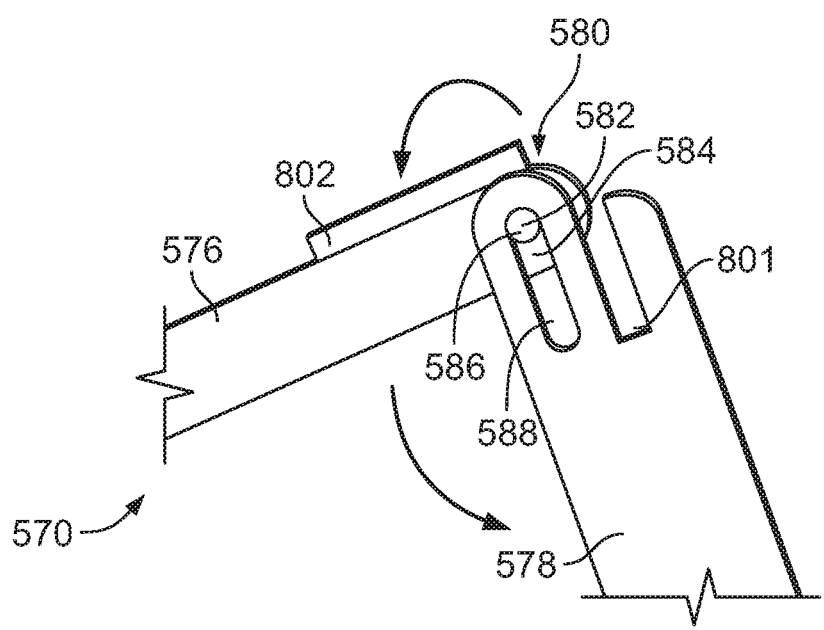
FIG. 8B is a zoomed image of a second hinge in the support structure of FIG. 6 being moved to a folded position.

As shown in FIGS. 8A and 8B, either one of the support members 576, 578 may include a slot 801, and the other of the support members 578, 576 may include a protrusion 802 configured to engage the slot 801. The protrusion 802 and slot 801 may be configured to avoid the hinge 580 folding backward.

Also as shown in FIGS. 8A and 8B, the hinge 580 may be a pivot joint including a cylindrical rod 582 extending from one support member 576, 578 and adapted to rotate within an aperture 584 of the other support member 578, 576. The aperture 584 may be elongated in a lengthwise direction of its support member, such that the rod 582 is capable of translating along a length of the aperture 584. In operation, when the support members 576, 578 are being unfolded from the storage position to the access position, the rod 582 may begin at a far end 586 of the aperture 584. Then, upon the support members being unfolded (e.g., 180 degrees apart), the rod 582 may be slid from the far end 586 to a close end 588 of the aperture 584. Translating the rod 582 along the length of the aperture 584 may in turn cause the protrusion 802 to engage the slot 801, thus rotationally locking the support members 576, 578 in place. Conversely, the support members 576, 578 may be unlocked after first pulling the slot 801 out of the protrusion 802 in the length direction.

Figure 9A:
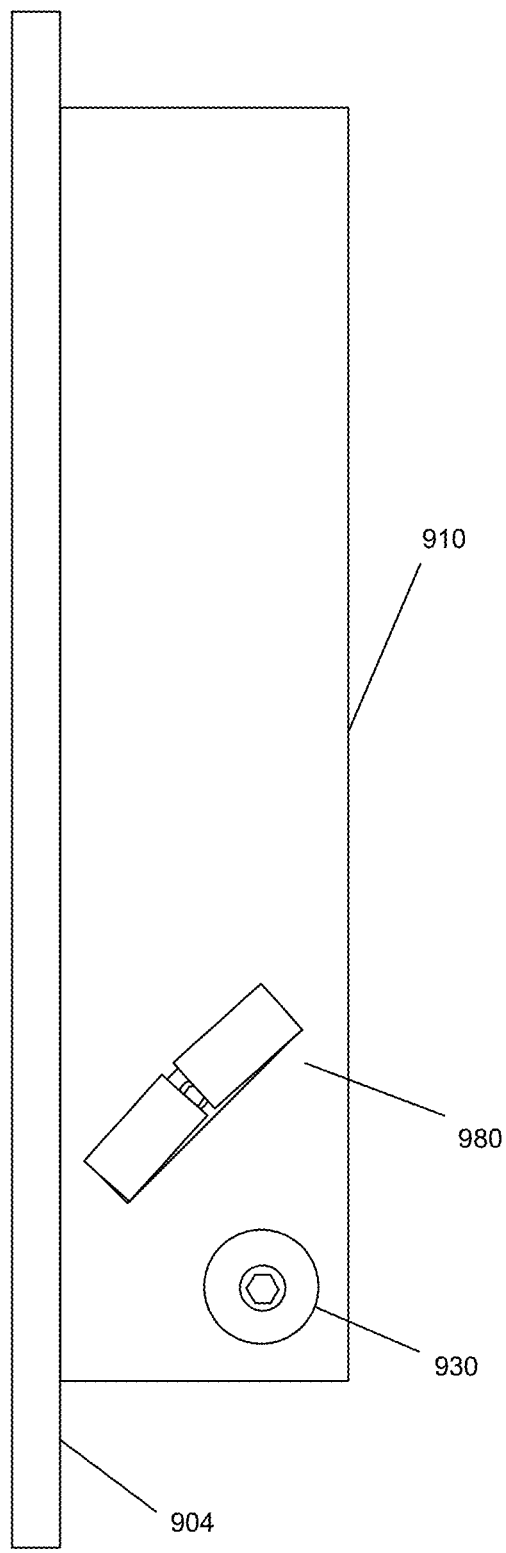
FIGS. 9A and 9B are side views of alternative support structures in accordance with aspects of the disclosure.
Figure 9B:
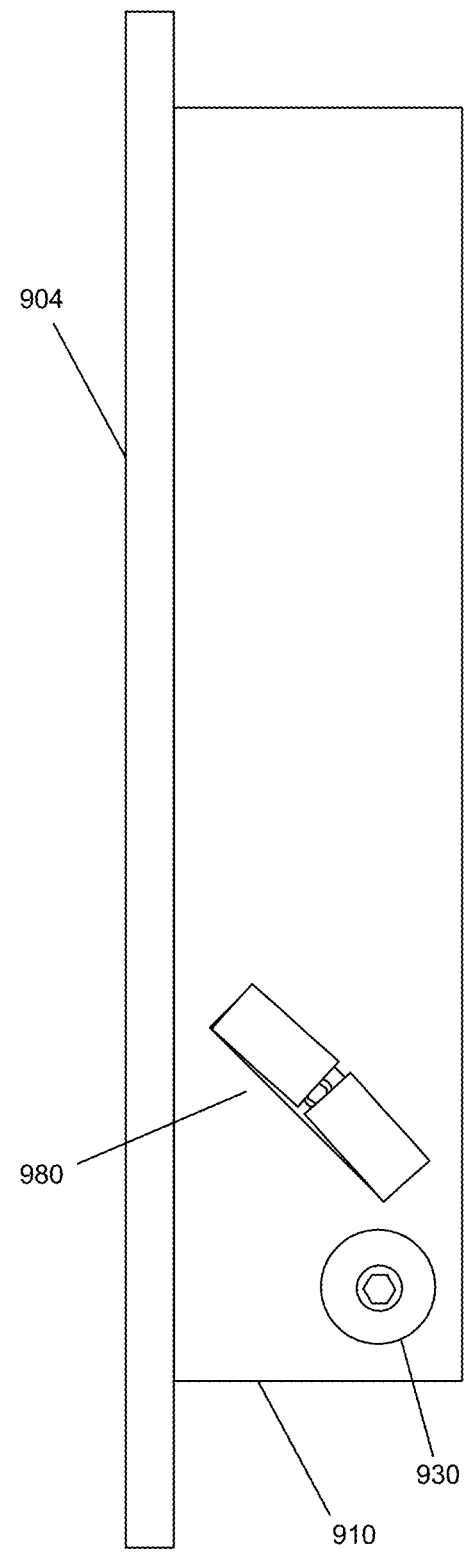

FIGS. 9A and 9B, are side views of example anchor members 910 mounted to a wall 904. In each example, a hinge 930 for connecting the anchor member 910 to a support arm (not in view in FIGS. 9A and 9B, as the assemblies are in the storage position and the support arms occupy the space behind the anchor member) is shown. A hanger 980 for supporting cables is also shown.

As demonstrated by FIGS. 9A and 9B, an angle of the hanger relative to the assembly may differ depending on one or more factors, such as a direction from which the cables originate before reaching the patch panel. In the example of FIG. 9A, the cables may originate from above the assembly, e.g., from the ceiling. Hence, an opening of the hanger 980 is angled to face partially upwards and partially outwards from the wall. In the example of FIG. 9B, the cables originate from below the assembly, e.g., from the floor. Hence, an opening of the hanger 980 may be angled to face partially downwards and partially outwards from the wall. In this manner, the hanger 980 can be angled to accommodate efficient routing of the cables from their point of origin to the front face of the patch panel.

The above examples generally describe operation of a support assembly for a one-sided patch panel mounted thereon. However, the support assembly can also be used to support a two-sided patch panel having cable connectors on each of a front side (facing the user in the access position) and a back side (facing the wall in the access position) of the patch panel. In such an example, the cable connectors on the back side of the patch panel may not be accessible when the assembly is in the access position, as the cable connectors would face and possibly be right up against the wall. However, when the assembly is in the storage position and the front end of the patch panel is inaccessible since it faces upward or downward (depending on whether the assembly folds up or folds down, respectively), the cable connectors on the back end may become accessible to the user.

The above examples also generally describe a support assembly that is mountable to a wall. However, in other examples, a support assembly may be provided in another location without requiring a rack. For example, a support assembly may be stored under a floor in order to save space. The floor may be a floor of an indoor space such as a building, or of an outdoor space such as a hatch to a hole in the ground.

Figure 10:
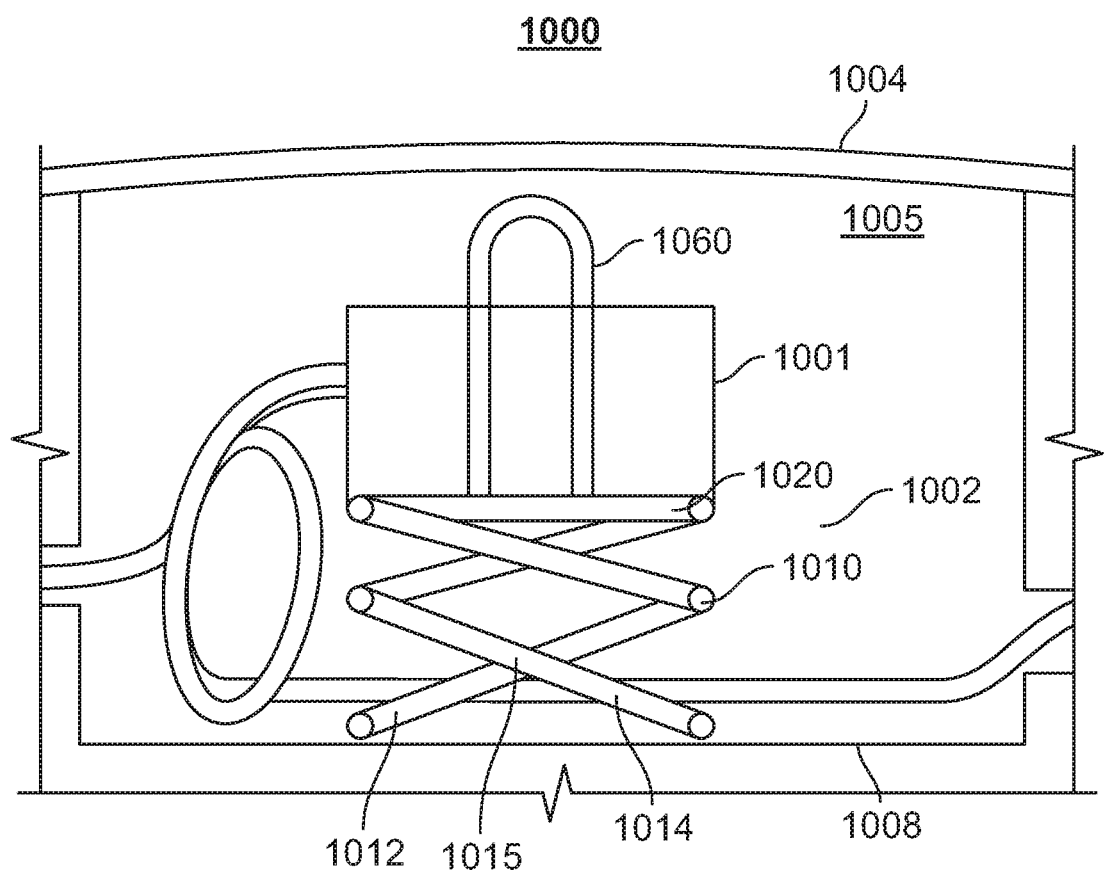
FIG. 10 is a front view of a cable management system having a support structure for mounting the cable management system underneath a floor in a storage position, in accordance with an aspect of the disclosure.

FIG. 10 shows an example cable management unit 1000 including a support assembly 1002 for mounting a patch panel 1001 under a floor 1004. As shown in FIG. 10, a cavity 1005 may be formed underneath the floor 1004, and the support assembly 1002 and patch panel 1001 may be positioned inside the cavity 1005. The cables 1006 may be fed under the floor 1004 into the cavity 1005 and to connection ports in the patch panel 1001. Furthermore, the assembly 1002 may be configured to move the patch panel 1001 between a storage position underneath the floor 1004 and an access position in which the patch panel 1001 is moved above a plane of the floor 1004 through an opening in the floor.

Referring to the example of FIG. 10, the support assembly 1002 may include a scissor lift 1010 and a platform 1020 positioned on top of the scissor lift 1010. The scissor lift may include a first foldable support 1012 and a second foldable support 1014. The foldable supports 1012, 1014 may be positioned on a bottom surface 1008 of the cavity 1005, and arranged in a foldable crisscross pattern with one another, and may further be connected to one another at hinged connections 115. Applying a tension force to the top and/or bottom of the foldable supports may cause the scissor lift 1010 to elongate and become narrower. Conversely, applying a compression force to the top and/or bottom of the foldable supports may cause the scissor lift 1010 to shorten and become wider.

Each of the foldable supports 1012, 1014 may have a bottom end resting on the surface 1008, and a top end connected to the platform 1020. The platform may further be adapted to support a chassis of the patch panel 1001, whereby the panel may be secured to the top surface of the platform 1020. Thus, when the scissor lift 1010 elongates, the platform 1020 is translated upwards towards the floor 1004, and the patch panel 1001 is also translated upwards and may even extend through the floor 1004 with proper clearance. The folded shortened state of the scissor lift 1010 may be thought of as its "storage position," and the elongated state may be thought of as the "access position."

Figure 11:
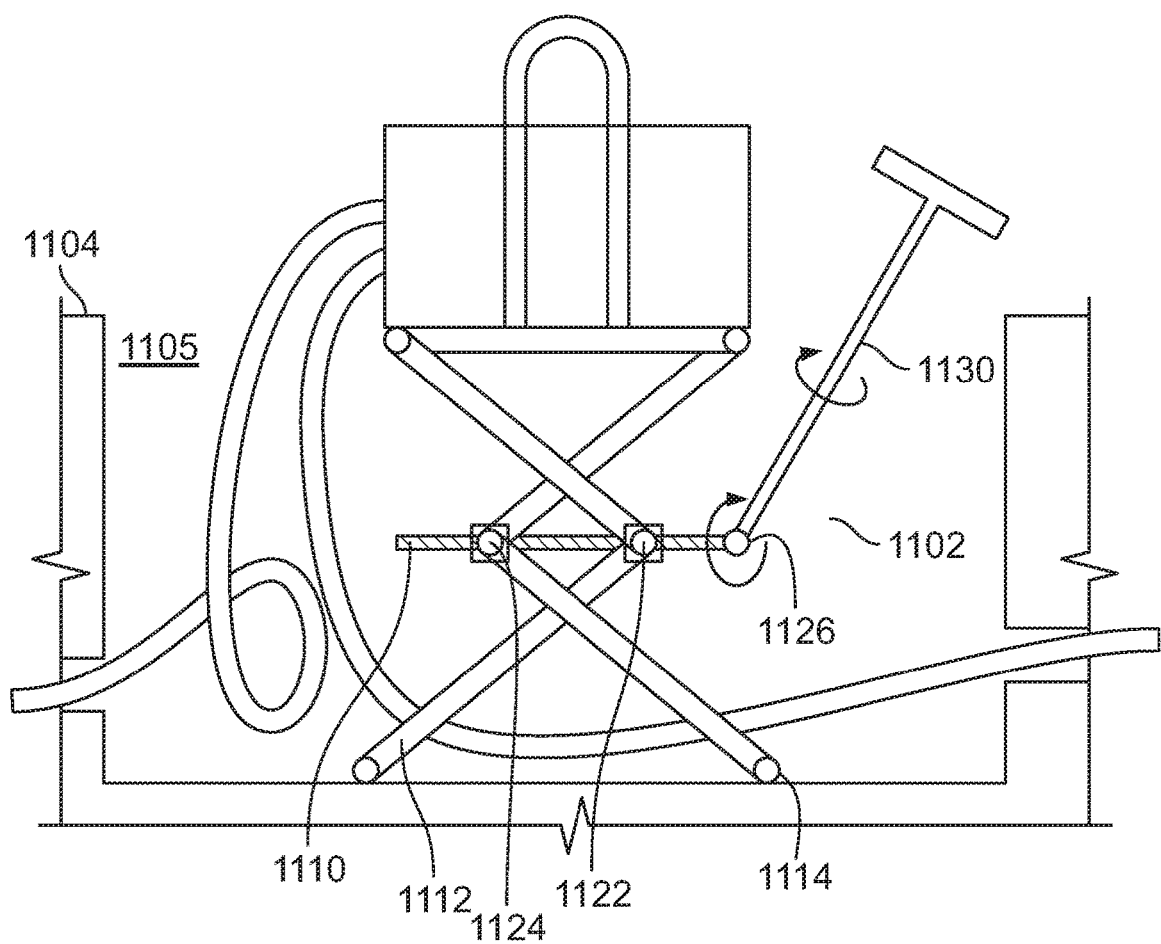
FIG. 11 is a front view of the cable management system of FIG. 10 having the support structure in a service position.
Figure 12:
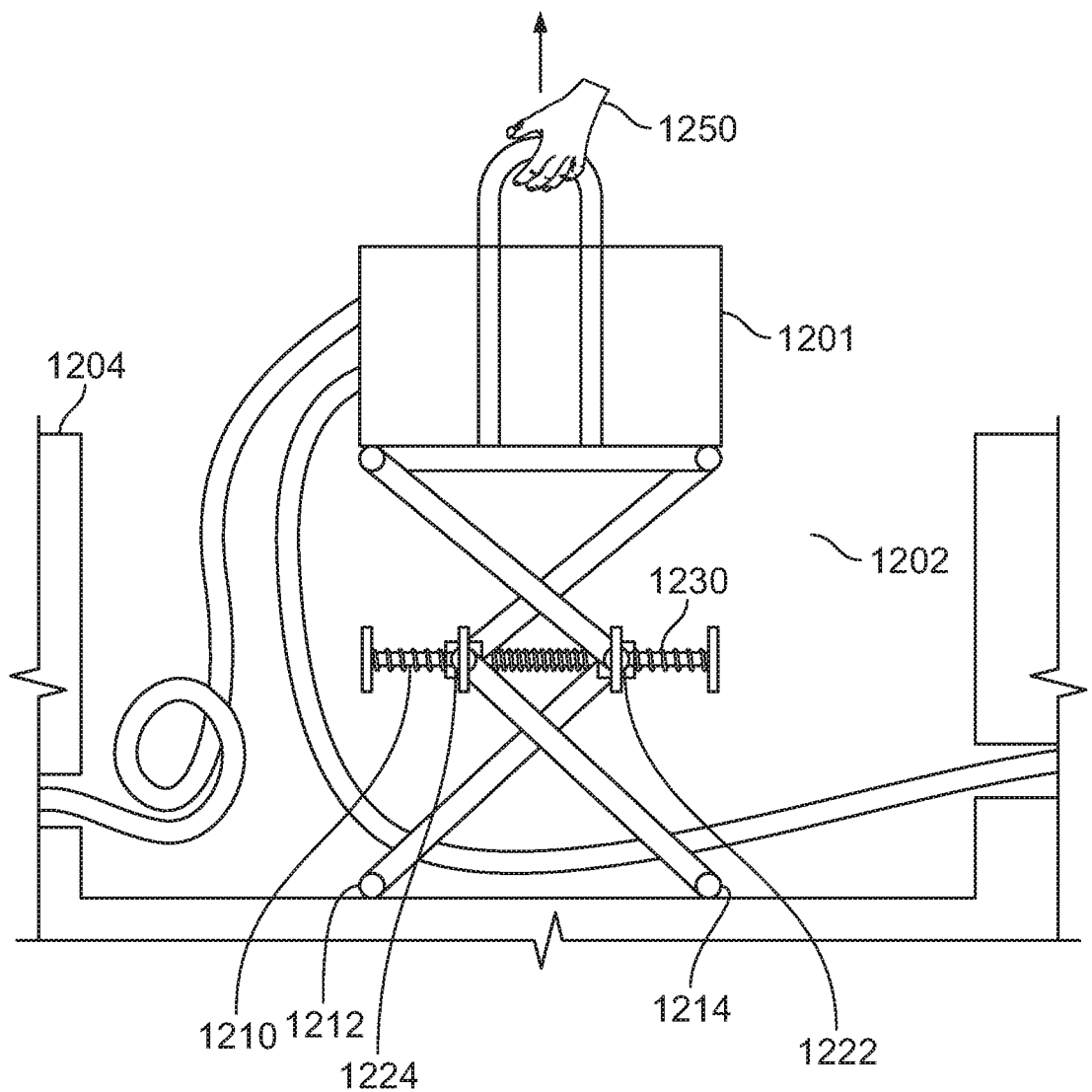
FIG. 12 is a front view of a cable management system having an alternative support structure for mounting the cable management system underneath a floor, shown in a service position.

A mechanism for controlling the tension and compression forces on the scissor lift 1010 may further be provided. Each of FIGS. 11 and 12 show an example of such a mechanism. Although the mechanisms are shown separately, it will be appreciated that both mechanisms may be incorporated into the same embodiment.

In the example of FIG. 11, the support assembly 1102 may include a shaft 1110 having a primary axis along a length of the shaft 1110, and extending along the primary axis between a foldable joint 1122 of a first foldable support leg 1112 and a foldable joint 1124 of a second foldable support leg 1114. The shaft 1110 may be coupled to each of the foldable joints 1122, 1124. At the joint of the first foldable support leg 1112, the shaft 1110 may be axially fixed in place but capable of rotating around the primary axis. The joint of the second foldable support leg 1114 may be threaded, such that the shaft 1110 may translate axially relative to the joint as the shaft 1110 rotates around its primary axis. As a result, when the shaft 1110 rotates around the primary axis, a lateral distance between the first and second joints (in the direction of the primary axis of the shaft) changes, depending on the direction in which the shaft 1110 rotates. When the distance increases, the foldable support legs 1112, 1114 fold and the assembly 1102 moves towards the storage position. When the distance decreases, the foldable support legs 1112, 1114 extend and the assembly 1102 moves towards the access position.

In the example of FIG. 11, a crank 1130 is used to manually rotate the shaft 1110. The crank 1130 may be configured to cause the shaft 1110 to rotate when the crank is rotated about a secondary axis along the length of the crank 1130. Thus, the assembly 1102 may be raised or lowered depending on a direction in which the crank 1130 is rotated.

The crank 1130 may be removeably coupleable to the shaft 1110. For instance, when the support assembly 1102 is in storage, the crank 1130 may be stored in the cavity 1105. Then when the opening in the floor 1104 is opened, the crank 1130 may be accessed through the opening and manually attached to an end 1126 of the shaft.

In other examples, an automatic actuator may be coupled to the shaft. The actuator may be used in addition to or in lieu of the crank.

In the example of FIG. 12, the support assembly 1202 may include a shaft 1210 having a primary axis along a length of the shaft 1210, and extending along the primary axis between a foldable joint 1222 of a first foldable support leg 1212 and a foldable joint 1224 of a second foldable support leg 1214. The shaft 1210 may be coupled to each of the foldable joints 1222, 1224. At the joint of the first foldable support leg 1212, the shaft 1210 may be fixed in place, both axially and rotationally. At the joint of the second foldable support leg 1214, the shaft may be free to slide axially. One or more spring loaded elements 1230 may be included on the shaft, such as one or more compressed coils 1230 wound helically around the shaft. The coils 1230 may provide a spring force to the foldable joints 1222, 1224, and may cause a lateral distance (along the primary axis) between the first and second foldable joints to become shorter. In this manner, the coils 1230 may bias the support assembly towards the access position. In some instances, the force applied by the coils 1230 may be chosen such that a weight of the patch panel 1201 (including the platform 1220) may counterbalance the force of the coils 1230, such that the assembly 1202 acts as if it is weightless. This may enable a user 1250 accessing the patch panel from above the floor 1204 to pull the assembly 1202 up and push the assembly 1202 back down with relative ease, regardless of a weight of the patch panel 1201, assembly 1202 or both.

As with the examples of FIGS. 1-9, the patch panels of FIGS. 10-12 may include a chassis, whereby the chassis may be mounted to the platform for added stability.

Figure 13A:
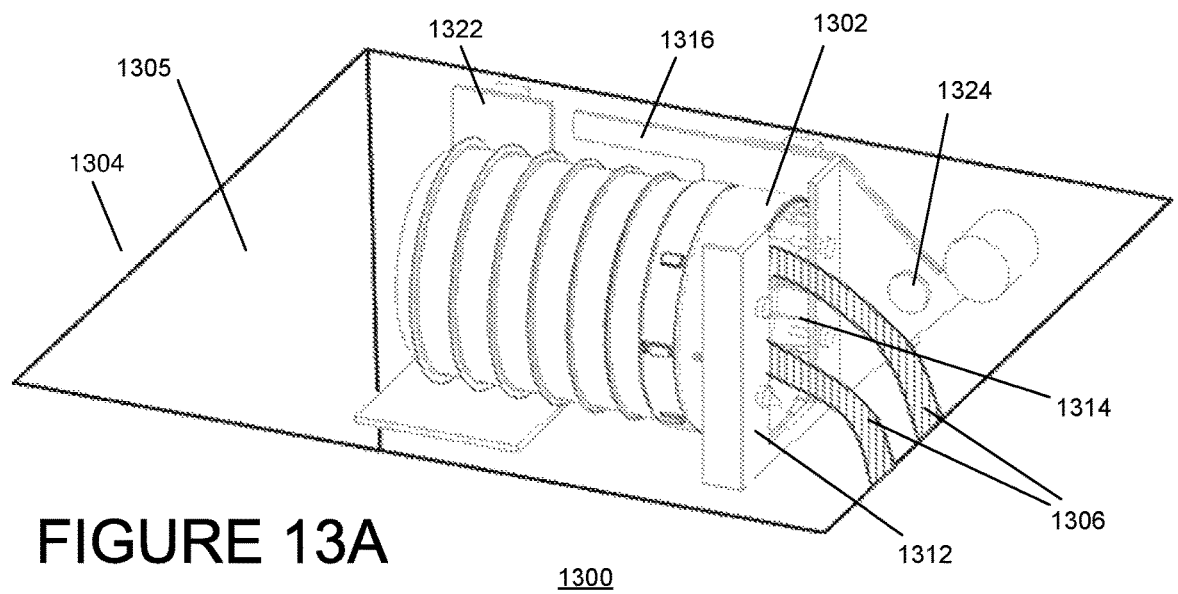
FIG. 13A is a perspective view of a cable management system having another example support structure in a storage position.
Figure 13B:
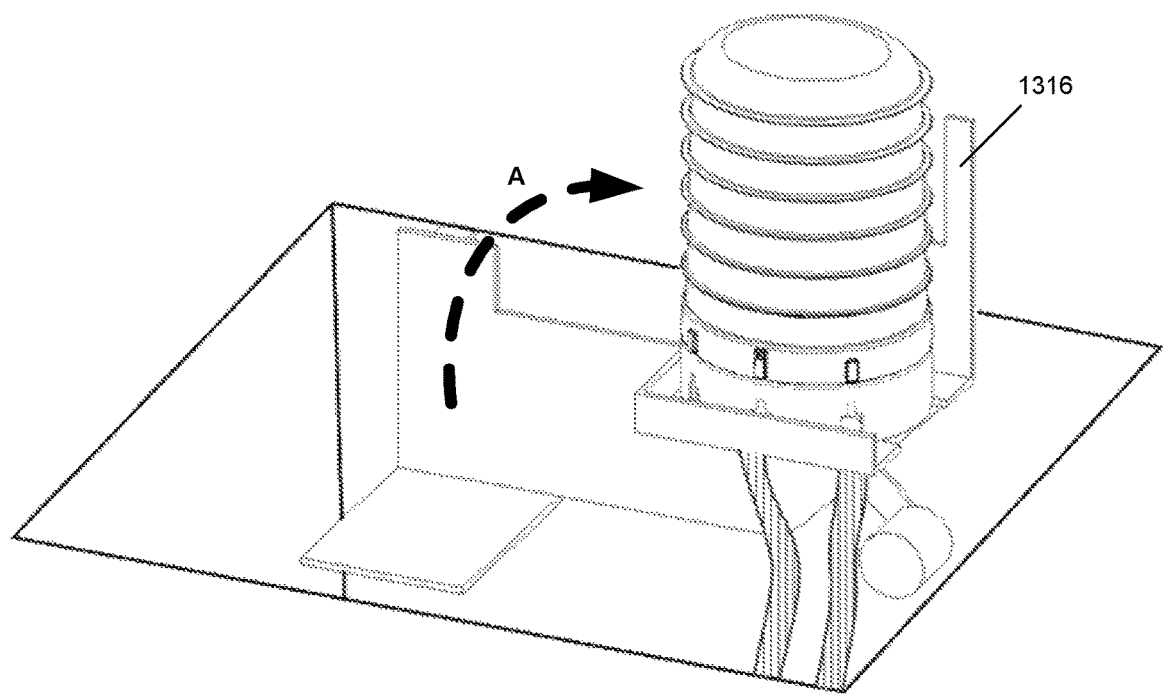
FIGS. 13B and 13C are perspective views of the cable management system of FIG. 13A in a service position.
Figure 13C:
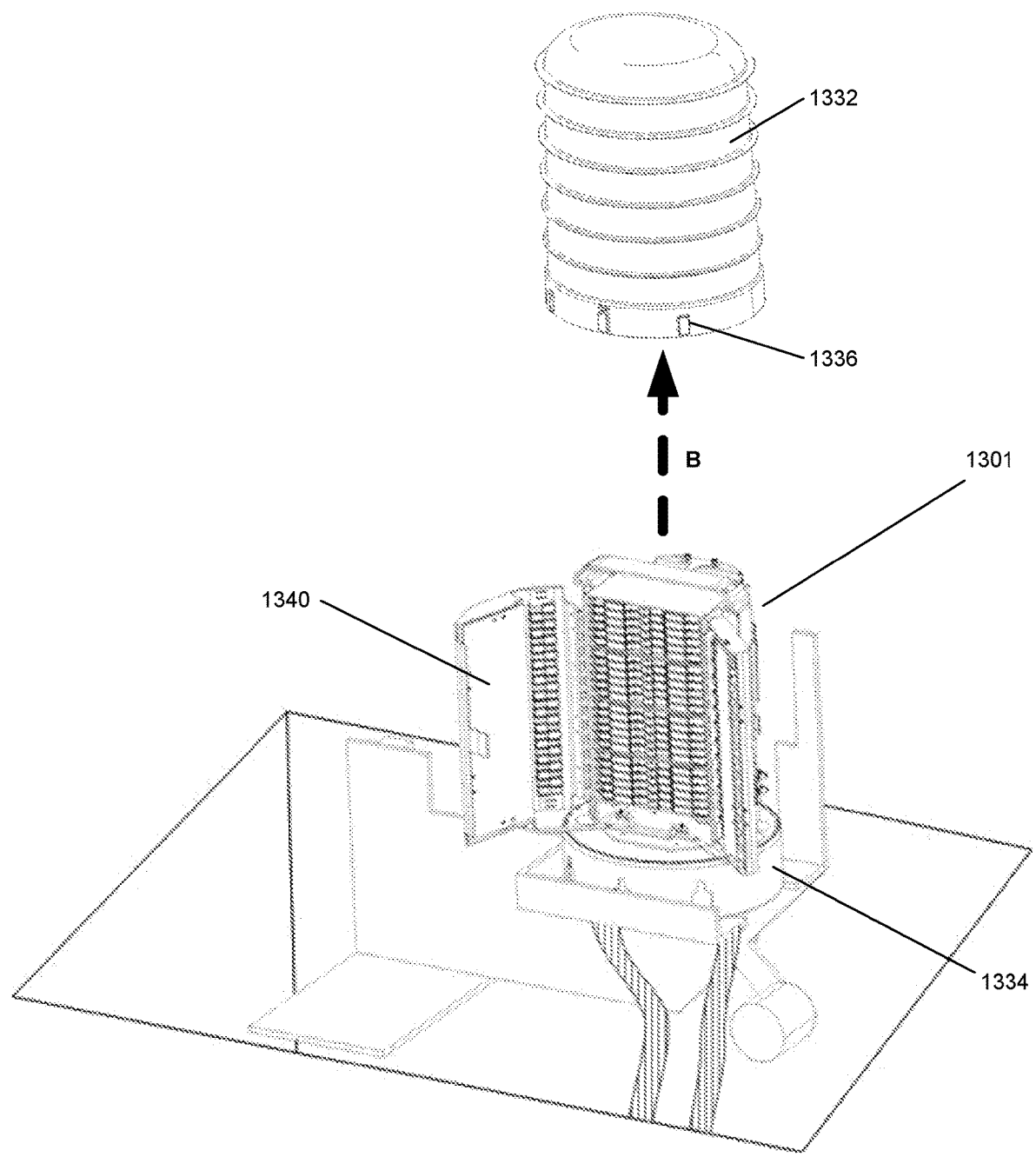

FIGS. 13A through 13C show another example cable management unit 1300 including a support assembly 1302 for mounting a patch panel 1301 under a floor 1304. As noted above, the floor may be a floor of an indoor or an outdoor space. As shown in FIG. 13A, a cavity 1305 may be formed underneath the floor 1304, and the support assembly 1302 and patch panel (contained inside the support assembly 1302) may be positioned inside the cavity 1305. The cables 1306 may be fed under the floor 1304 into the cavity 1305 and to connection ports in the patch panel.

The support assembly 1302 may be configured to move the patch panel between a storage position underneath the floor 1304 and an access position in which the patch panel is moved above a plane of the floor 1304 through an opening in the floor. FIG. 13A shows the storage position and FIG. 13B shows the access position.

The support assembly 1302 may include a base 1312 on which the patch panel is mounted. The base 1312 may include an opening 1314 through which the cables 1306 may pass in order to connect to an interior of the patch panel. The base 1312 may be tilted on its side when positioned in the storage position. This may be beneficial for minimizing the vertical space required for storage of the patch panel under the floor. One or more sides of the base 1312 may extend in a height direction of the patch panel (which in the storage position may be parallel to a plane of the floor) in order to provide increased security or stability for storing the patch panel. Additionally, one of the sides that is close to an edge of the opening 1305 may include an extension that forms a handle 1316. The handle 1316 may function as a lever, whereby pulling the handle upward may cause the base 1312 to pivot about a supporting member 1322 and raise the patch panel above the ground.

The supporting member 1322 may be fixedly mounted or otherwise anchored to an interior wall of the opening 1305 under the floor 1304, and the base 1312 may be hingedly coupled to the supporting member 1322 by a hinge 1324. The hinge 1324 may be located below the patch panel along a height direction of the patch panel (which may be parallel to a plane of the floor when in the storage position), such that pulling the handle 1316 upwards causes the patch panel 1301 to rotate from a sideways orientation to an upright orientation. Additionally, the hinge 1324 may be positioned at a location that provides support for the base 1312 and patch panel 1301 when rotated into the access position. In the example of FIG. 13A, the hinge 1324 is positioned underneath the patch panel along a height direction of the patch panel (which may be parallel to a plane of the floor when in the storage position) so that the weight of the patch panel 1301 at least partially rests on the hinge 1324 when the patch panel 1301 is in the access position.

FIGS. 13B and 13C show a process by which the patch panel supported by the support assembly 1302 of FIG. 13A may be accessed. In FIG. 13B, the assembly is shown in the access position, and dashed arrow A shows a rotational motion of the patch panel 1301 from a sideway orientation to an upright orientation, which is caused by lifting the handle 1316. In FIG. 13C, a protective cover 1332 of the patch panel 1301 is lifted up in the direction of dashed arrow B in order to reveal the patch panel 1301. The patch panel 1301 may be supported by a mounting base 1334. The cover 1332 may also include one or more fastening members 1336, such as any one or combination of buttons, springs, straps, locks, and the like, in order to fasten the cover 1332 to the base 1334. The patch panel 1301 may also include one or more panels or doors 1340 that can be opened after the cover 1332 is lifted off of the base 1334.

In the example of FIGS. 13A-13C, the top of the patch panel is subject to a larger range of motion than the bottom of the patch panel. This may be beneficial since the opening to the patch panel underneath the base remains in relatively the same area. As a result, the cables 1306 do not have to stretch and contract in order to remain connected to the patch panel.

Figure 14A:
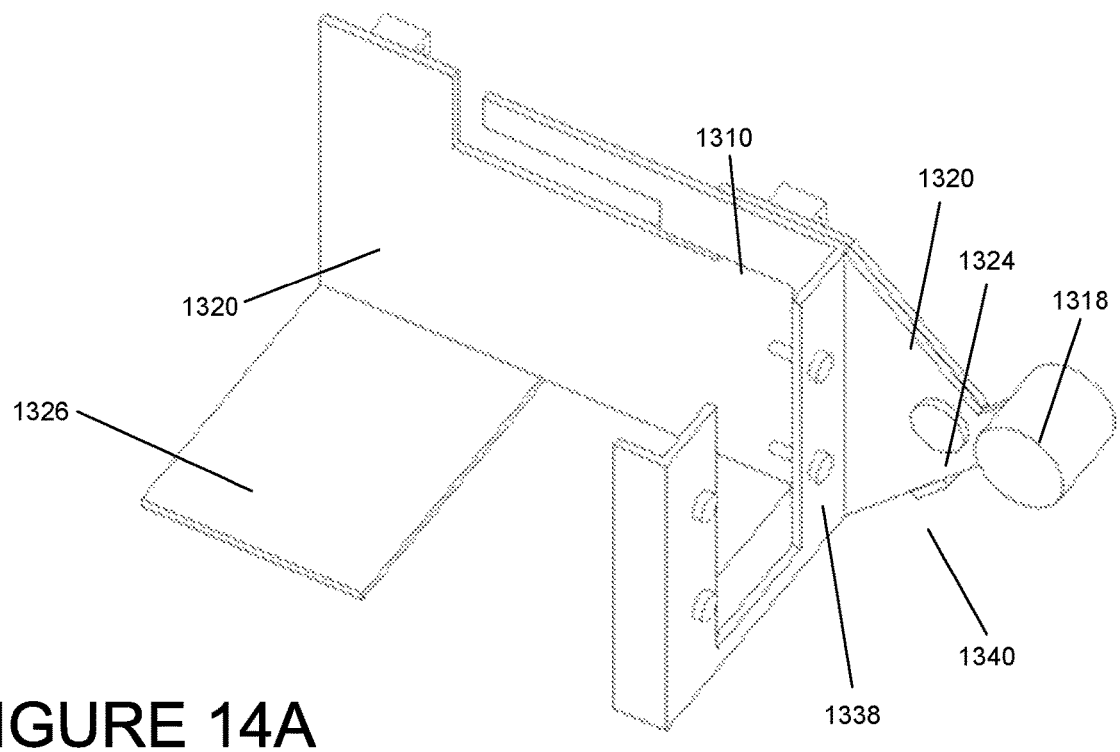
FIG. 14A is a zoomed view of the support structure of FIG. 13A in the storage position.
Figure 14B:
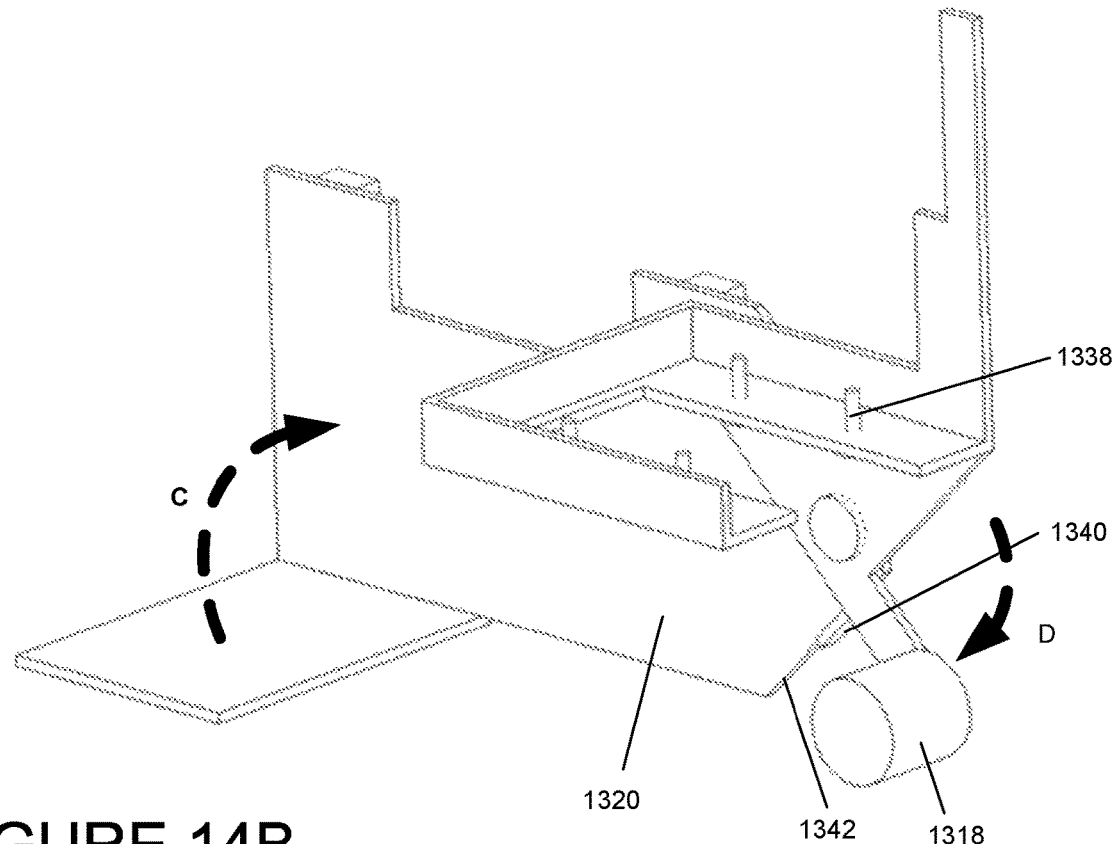
FIG. 14B is a zoomed view of the support structure of FIGS. 13B and 13C in the service position.

FIGS. 14A and 14B show zoomed views of the support assembly 1302 in order to highlight additional features of the assembly.

As shown in FIG. 14A, the assembly 1302 may include two boards 1310 and 1320 formed along a common plane. The boards may be hingedly coupled by the hinge 1324. A first board 1310 may extend outward from the common plane to provide the base on which the patch panel is configured to be supported. Additionally, the handle may be fashioned out of the first board 1310. The second board 1320 may include the supporting member. A shelf 1326 may extend outward from the second board in the same direction as the base. The shelf 1326 may be configured to support a top portion of the patch panel when the patch panel is in the storage position. Optionally, the shelf 1326 may include a hinge (not shown) for folding the shelf up against the second board 1320, in the direction of dashed arrow C, when the shelf 1326 is not in use, such as if it is required to enter the opening.

Also shown in FIG. 14A is a counterweight 1318. The counterweight 1318 is positioned on an opposite side of the hinge 1324 from the patch panel. This may reduce an amount of force required in order to lift the patch panel using the handle. Also shown in FIG. 14A are a plurality of bolts 1338 configured to fasten the base of the patch panel (or the base of the patch panel cover) to the base of the support assembly.

As shown in FIG. 14B, the support assembly may include a stopper 1340 mounted to the first board 1310 and configured to engage a sidewall of the second board 1320 when the first board is pivoted about the hinge 1324 from the storage position to the access position. Also shown in FIG. 14B is a position of the counterweight 1318, which moves along the rotational path shown by dashed arrow D. In the access position, the counterweight 1318 is positioned such that a center of gravity of the pivoted portion of the support assembly (including the patch panel, the first board and base, and the counterweight) in the access position is offset to a side of the hinge. In this manner, the counterweight 1318 may apply a constant force on the stopper 1340 to keep the stopper 1340 engaged with the sidewall 1342. In essence, the weight of the counterweight 1318 positioned on one side of the hinge may prevent the patch panel from tipping over in the direction of the other side of the hinge and back into the storage position.

Figure 15:
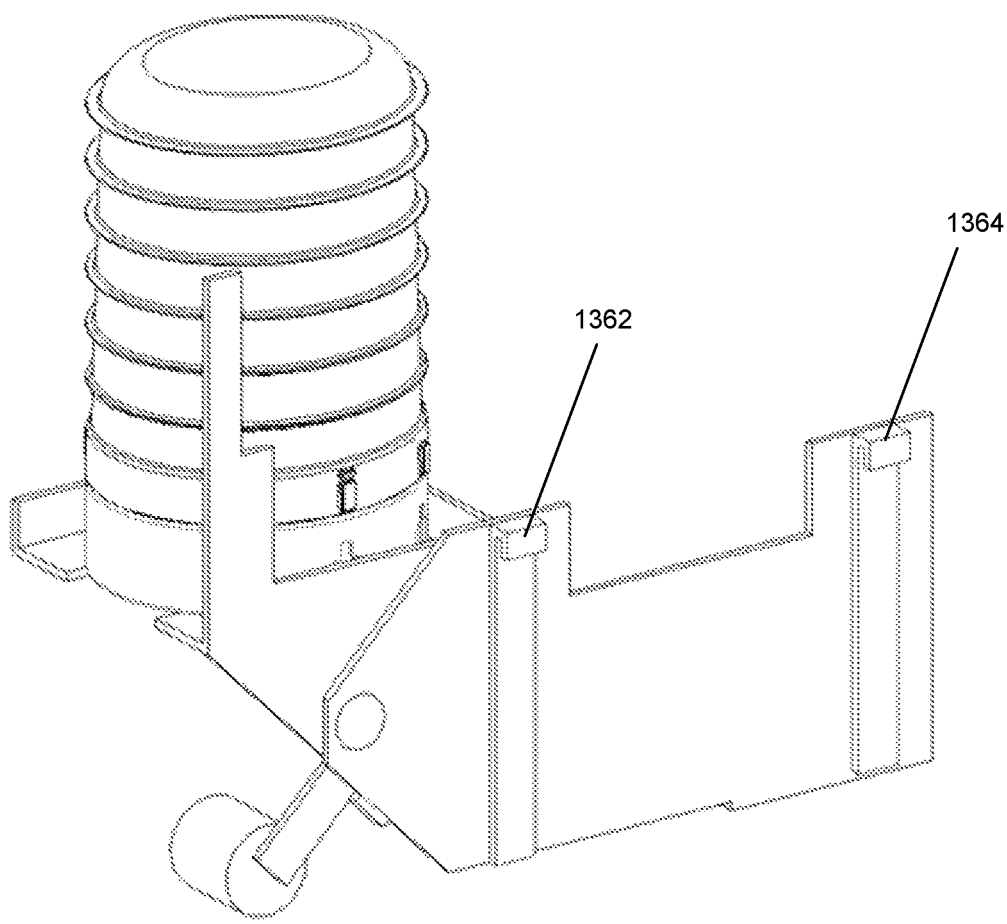
FIG. 15 is a reverse angle view of the support structure of FIGS. 13B and 13C.

FIG. 15 shows a reverse angle of the support assembly 1302 in order to highlight an additional features of the assembly. In particular, FIG. 15 shows the second board 1320 of the assembly including a first hook 1362 and a second hook 1364 affixed to a back surface of the assembly. The hooks 1362, 1364 are configured to hang the support assembly on an interior wall of the opening.

Figure 16A:
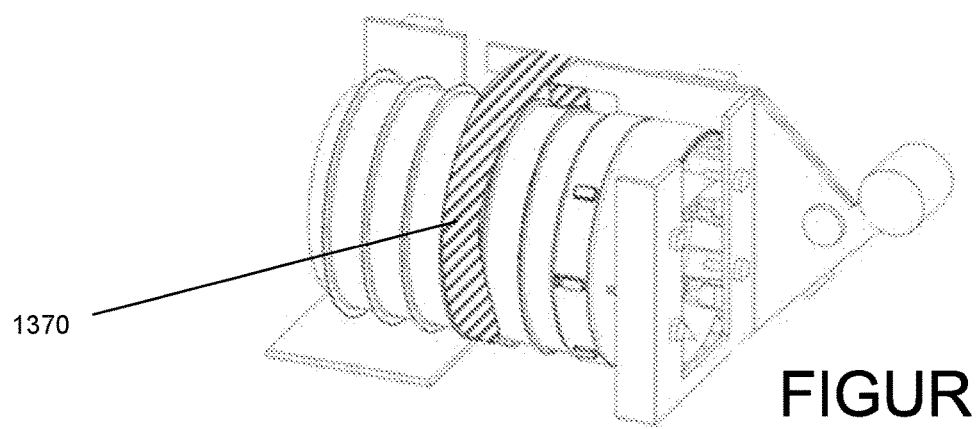
FIG. 16A is a perspective view of the cable management system of FIGS. 13-15 having another example support structure in a storage position.
Figure 16B:
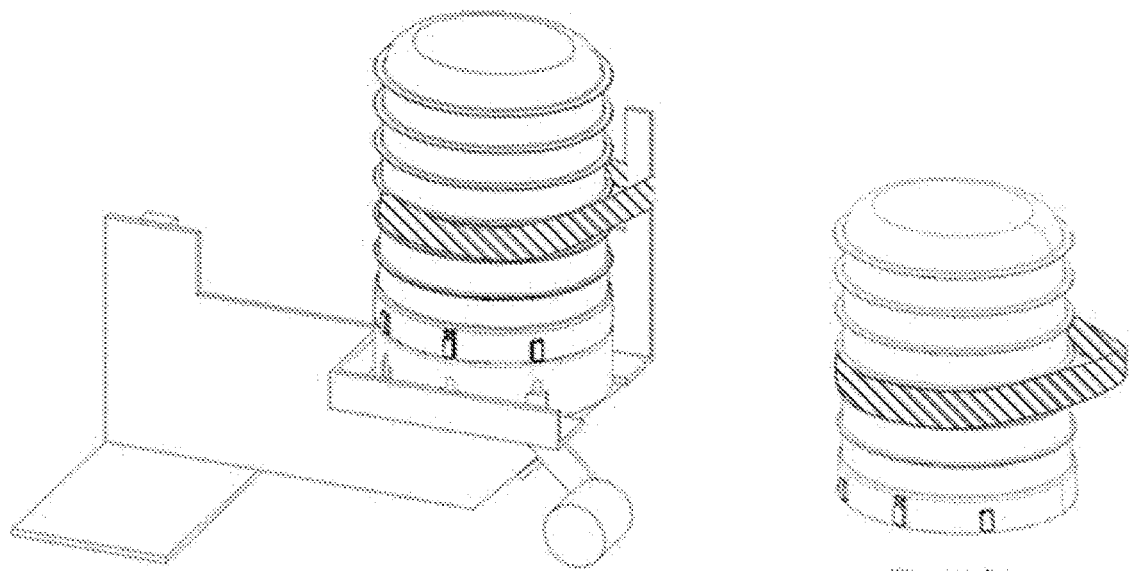
FIGS. 16B and 16C are perspective views of the cable management system of FIG. 16A in a service position.
Figure 16C:
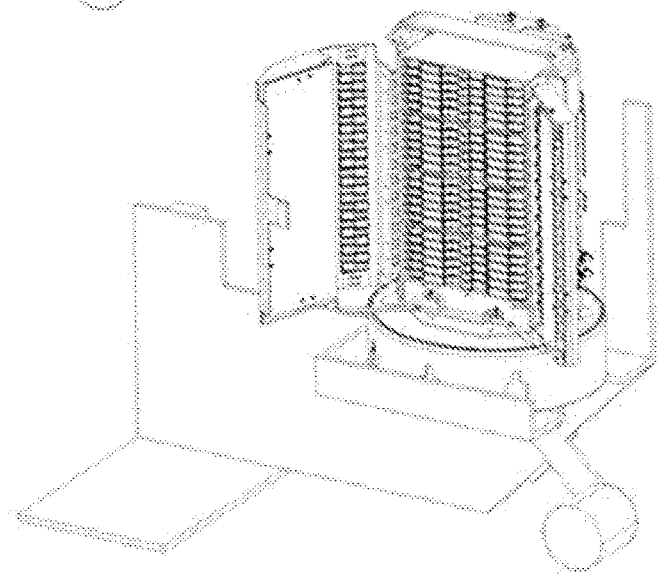

FIGS. 16A-C show an additional feature of the assembly. In particular, FIG. 16A shows a retaining element such as a strap 1370 to provide additional support for the patch panel when it is in the storage position. The strap 1370 is looped around both the patch panel and the base of the support assembly. In the example of FIG. 16A, in which the support assembly includes a shelf for supporting a top of the patch panel, the strap 1370 is positioned to support a midpoint of the patch panel between the base and the shelf. However, in other examples, the strap 1370 may be positioned in line with a different portion of the patch panel, such as a top portion where the support assembly does not include a shelf. Additionally, in the example of FIG. 16A, the strap 1370 is looped over the handle of the support assembly. However, in other examples, the strap 1370 may be looped around a different portion of the base that is not part of the handle in order to provide improved access to the handle.

FIG. 16B shows the example assembly of FIG. 16A in the access position. In the example of FIG. 16B, the strap 1370 is fastened around the patch panel tight enough that to remains in place when the patch panel is reoriented to its upright or access position. FIG. 16C shows the example of assembly with the cover of the patch panel removed. In the example of FIG. 16C, the strap 1370 may be removed with the cover. In one such example, the strap 1370 may be fastened to the cover, such that removal of the cover results in removal of the strap 1370.

In the examples of FIGS. 13-16, the support assembly is shown as being used to store a patch panel under a floor. However, in other examples, a similar configuration of support assembly may be used to store a patch panel above a ceiling. For instance, the patch panel may be stored in a upright position, and then tilted onto its side when accessed using a similar support assembly. In such a case, the handle of the support assembly may be positioned close to an opening of the ceiling.

In any of the above examples, the support assemblies described herein may include additional features for making storage and access of the patch panels even easier. For example, the support assemblies may further include one or more handles for pulling or push the assemblies between storage and access positions. Once such handle 1060 is illustrated, for sake of example, in each of FIGS. 10-12, and another such handle 1316 is illustrated, for further sake of example, in FIGS. 13-16.

Figure 17A:
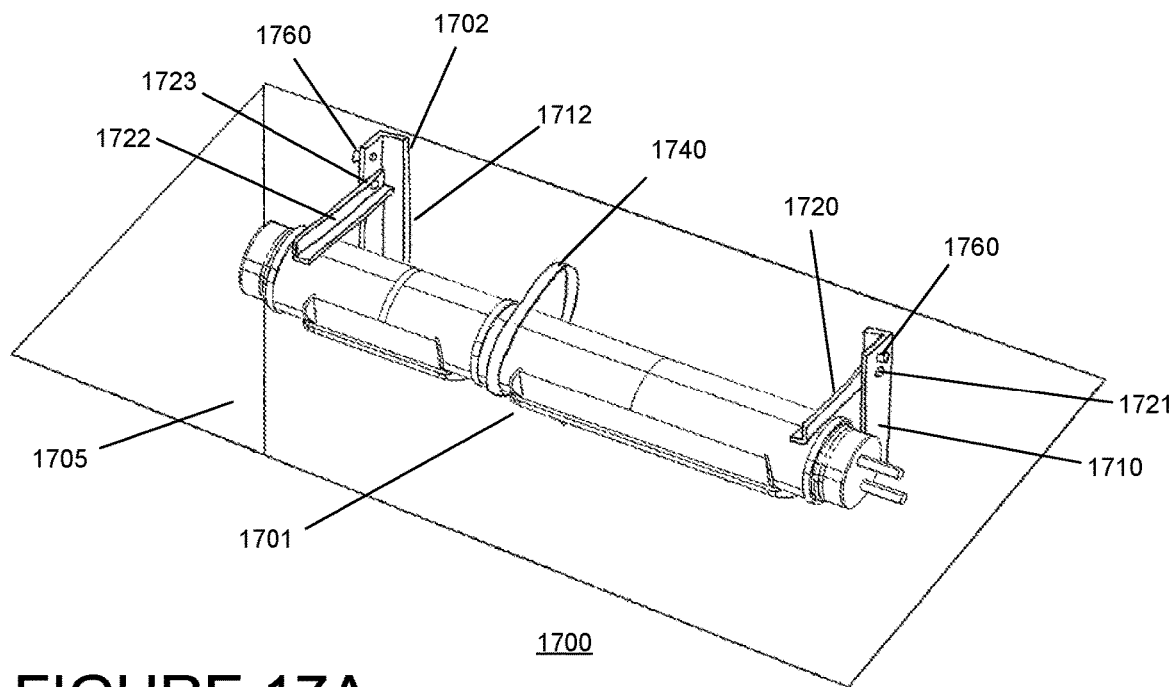
FIG. 17A is a perspective view of another cable management system having an example support structure in a storage position.
Figure 17B:
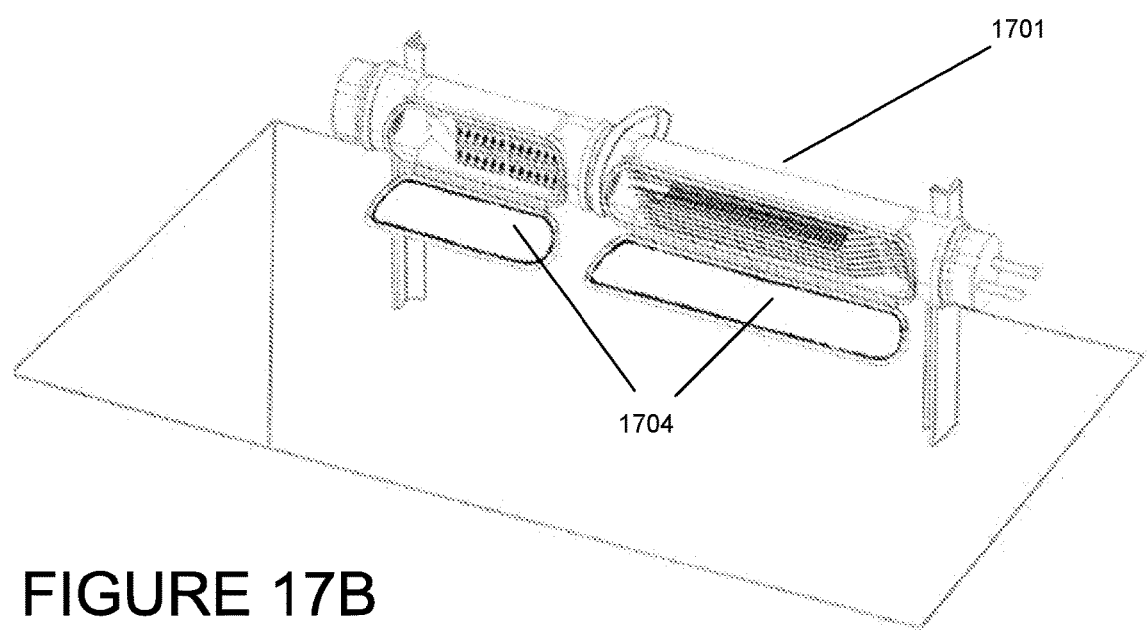
FIG. 17B is a perspective view of the cable management system of FIG. 17A in a service position.

The support assemblies described herein may also be adapted to accommodate and support other forms and shapes of hardware, including other designs of patch panels. For the sake of example, FIG. 17A shows a strand-mounted cable management unit 1700 having a support assembly 1702 that is adapted to support a housing 1701. The support assembly 1702 of FIG. 17A is comparable to the support assembly 502 of FIGS. 5 and 6. In FIGS. 5 and 6, the support assembly 502 was configured to fold downwards against a wall, whereas in FIG. 17A, the support assembly 1702 is configured to be stored in an opening 1705 below a floor and bent upwards in order to provide access to an interior of the housing 1701 via one or more panels 1704, as shown in FIG. 17B.

The support assembly 1702 may include anchor members 1710, 1712 affixed to a wall of the opening 1705, and may further include hinge points 1721, 1723 hingedly connecting the anchor members 1710, 1712 to respective support arms 1720, 1722. The support assembly 1702 may also include one or more pins 1760 comparable to the pins 560 described in connection with FIGS. 5 and 6 and shown in greater detail in FIG. 7. Additionally or alternatively, the support assembly 1702 may including a retaining element such as a strap 1740 to provide additional support for the housing 1701 when it is in the storage position, the access position or both. The strap 1740 may be affixed to the wall on which the support assembly 1702 is mounted, and may be looped around the housing 1701.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A support assembly for mounting a patch panel to a wall, the support assembly comprising:
    first and second anchor members adapted to be anchored to the wall;
    a first support arm hingedly coupled to the first anchor member at a first hinge point;
    a second support arm hingedly coupled to the second anchor member at a second hinge point, wherein the first and second support arms are adapted to be coupled to a chassis of the patch panel, whereby the patch panel is supported by the first and second support arms;
    a front hanger mounted to one of the first and second support arms or to the patch panel in proximity to a front face of the patch panel, and adapted to support one or more cables extending from the front face of the patch panel; and
    a back hanger mounted to said one of the first and second anchor members in proximity to the corresponding hinge point of the anchor member, and adapted to support the one or more cables supported by and extending from the front hanger,
    wherein the first and second support arms are configured to rotationally pivot about the first and second hinge points respectively between a storage position and an access position, wherein the first support arm and second support arm extend outward from the wall when in the access position and are substantially parallel to the wall in the storage position.

2. The support assembly of claim 1, wherein the first and second support arms extend parallel to the wall in an upward direction from the first and second hinge points, respectively, when in the storage position.

3. The support assembly of claim 2, wherein the first anchor member is coupled to the first support arm by a first pivot hinge, and the second anchor member is coupled to the second support arm by a second pivot hinge,
    wherein the first anchor member includes a first protrusion extending therefrom in a direction towards the first support arm, and the second anchor member includes a second protrusion extending therefrom in a direction towards the second support arm, and
    wherein each of the first and second support arms includes a respective first end adapted to be coupled to the chassis and a respective second end opposite the first end and adapted to engage the first and second protrusions, respectively, when the first and second support arms are rotationally pivoted to the access position.

4. The support assembly of claim 3, wherein the second end of the first support arm is bent and extends towards the first anchor member to engage the first protrusion, and wherein the second end of the second support arm is bent and extends towards the second anchor member to engage the second protrusion.

5. The support assembly of claim 3, wherein the respective second ends of first and second support arms are straight and extend in a direction away from the respective opposing first ends.

6. The support assembly of claim 2, wherein the first support arm is coupled to the first anchor member by a first torque hinge, and the second support arm is coupled to the second anchor member by a second torque hinge.

7. A cable management unit comprising:
    a support assembly as recited in claim 1; and
    a patch panel having a chassis mounted to the support assembly.

8. The cable management unit of claim 7, wherein the patch panel includes a plurality of cable connectors on a front side of the patch panel that faces away from the wall when the patch panel is in the access position, and wherein the plurality of cable connectors are configured to be interconnected with one another inside the patch panel.

9. The cable management unit of claim 7, wherein the patch panel includes a first plurality of cable connectors on a front side of the patch panel that faces away from the wall when the patch panel is in the access position, and second plurality of cable connectors on a back side of the patch panel that faces towards the wall when the patch panel is in the access position, wherein the first plurality of cable connectors are accessible when the patch panel is in the access position, and wherein the second plurality of cable connectors are accessible when the patch panel is in the storage position.

10. The support assembly of claim 1, wherein the front hanger extends away from said first or second anchor member farther than the front face of the patch panel.

* * * * *